(12) United States Patent
Kim et al.

(10) Patent No.: US 12,376,466 B2
(45) Date of Patent: Jul. 29, 2025

(54) DISPLAY DEVICE

(71) Applicant: LG Display Co., Ltd., Seoul (KR)

(72) Inventors: DongYoon Kim, Paju-si (KR); Gyujae Yohn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 465 days.

(21) Appl. No.: 17/977,850

(22) Filed: Oct. 31, 2022

(65) Prior Publication Data

US 2023/0209978 A1     Jun. 29, 2023

(30) Foreign Application Priority Data

Dec. 28, 2021    (KR) .................. 10-2021-0189948

(51) Int. Cl.
*H10K 59/131* (2023.01)
*H10K 59/35* (2023.01)
*H10K 102/00* (2023.01)

(52) U.S. Cl.
CPC ......... *H10K 59/131* (2023.02); *H10K 59/351* (2023.02); *H10K 2102/351* (2023.02)

(58) Field of Classification Search
CPC .............. H10K 59/351; H10K 2102/351
See application file for complete search history.

(56) References Cited

U.S. PATENT DOCUMENTS

2023/0071194 A1*  3/2023  Kim .................. H10K 59/126

* cited by examiner

*Primary Examiner* — Daniel P Shook
(74) *Attorney, Agent, or Firm* — Morgan, Lewis & Bockius LLP

(57) ABSTRACT

A display device includes a plurality of substrate patterns which is disposed so as to correspond to each of the plurality of sub pixels and is formed of one of a transparent conducting oxide and an oxide semiconductor; a plurality of transistors which is disposed in each of the plurality of sub pixels above the plurality of substrate patterns; and a plurality of light emitting diodes which is connected to the plurality of substrates to be disposed in each of the plurality of sub pixels, the plurality of sub pixels includes a first sub pixel and a second sub pixel which emit different color light and among the plurality of substrate patterns, a thickness of a first substrate pattern corresponding to the first sub pixel and a thickness of a second substrate pattern corresponding to the second sub pixel are different from each other.

15 Claims, 15 Drawing Sheets

DISPLAY DEVICE

CROSS-REFERENCE TO RELATED APPLICATIONS

This application claims the priority of Korean Patent Application No. 10-2021-0189948 filed on Dec. 28, 2021, in the Korean Intellectual Property Office, the disclosure of which is incorporated herein by reference.

BACKGROUND

Technical Field

The present disclosure relates to a display device, and more particularly, to a display device in which a plastic substrate is not used to improve a moisture permeation characteristic and a tearing defect during the laser lift off (LLO) process is minimized.

Discussion of the Related Art

As display devices which are used for a monitor of a computer, a television, or a cellular phone, there are an organic light emitting display device (OLED) which is a self-emitting device and a liquid crystal display device (LCD) which requires a separate light source.

An applicable range of the display device is diversified to personal digital assistants as well as monitors of computers and televisions and a display device with a large display area and a reduced volume and weight is being studied.

Further, recently, a flexible display device which is manufactured by forming a display element and a wiring line on a flexible substrate such as plastic which is a flexible material so as to be capable of displaying images even though the display device is folded or rolled is getting attention as a next generation display device.

SUMMARY

Accordingly, embodiments of the present disclosure are directed to a display device that substantially obviates one or more of the problems due to limitations and disadvantages of the related art.

An aspect of the present disclosure is to provide a display device which uses one of a transparent conducting oxide layer and an oxide semiconductor layer as a substrate, instead of a plastic substrate.

Another aspect of the present disclosure is to provide a display device which minimizes permeation of moisture and oxide.

Still another aspect of the present disclosure is to provide a display device which removes a plastic substrate to simplify a process and reduce a manufacturing cost.

Still another aspect of the present disclosure is to provide a display device in which a parasitic capacitance caused in various signal lines disposed in an active area and a non-active area is reduced to minimize noises.

Still another aspect of the present disclosure is to provide a display device which minimizes a defect to be generated by the LLO process.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a plurality of substrate patterns which is disposed so as to correspond to each of the plurality of sub pixels and is formed of one of a transparent conducting oxide and an oxide semiconductor; a plurality of transistors which is disposed in each of the plurality of sub pixels above the plurality of substrate patterns; and a plurality of light emitting diodes which is connected to the plurality of substrates to be disposed in each of the plurality of sub pixels, the plurality of sub pixels includes a first sub pixel and a second sub pixel which emit different color light and among the plurality of substrate patterns, a thickness of a first substrate pattern corresponding to the first sub pixel and a thickness of a second substrate pattern corresponding to the second sub pixel are different from each other.

Other detailed matters of the exemplary embodiments are included in the detailed description and the drawings.

According to the present disclosure, a transparent conductive oxide layer and an oxide semiconductor layer are used as a substrate of the display device to easily control a moisture permeability.

According to the present disclosure, a thin transparent conducting oxide layer and an oxide semiconductor layer are used as a substrate of the display device to improve a flexibility of the display device.

According to the present disclosure, a thin transparent conductive oxide layer and a thin oxide semiconductor layer are used as substrates of a display device to relieve a stress generated when the display device is bent or rolled and reduce a crack of the display device.

According to the present disclosure, a transparent conducting oxide layer and an oxide semiconductor layer are used as substrates of the display device to simplify a structure of the display device and reduce a manufacturing cost.

According to the present disclosure, a transparent conducting oxide layer and an oxide semiconductor layer are used as substrates of the display device to reduce the generation of static electricity and improve a display quality.

According to the present disclosure, the substrate of the display device is manufactured by a deposition process in a vacuum environment so that a substrate manufacturing time is shortened, and foreign materials formed on the substrate and a defect thereby may be minimized According to the present disclosure, a substrate which is formed of a transparent conducting oxide layer, or an oxide semiconductor layer is disposed only in an area where a signal line is not disposed so that a noise caused by the parasitic capacitance may be minimized.

According to the present disclosure, thicknesses of a plurality of substrate patterns of a substrate are configured to vary depending on areas of the plurality of substrate patterns so that the damage caused by the LLO process may be minimized.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
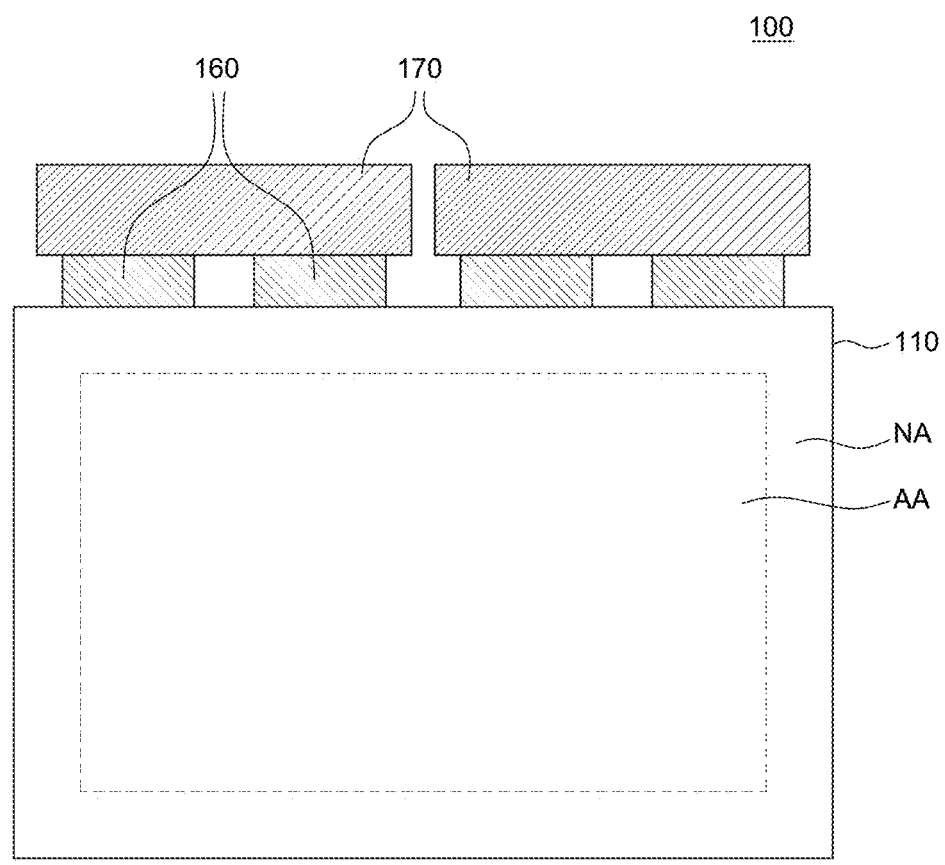
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various embodiments of the present disclosure will be described in detail with reference to accompanying drawings.

Figure 2:
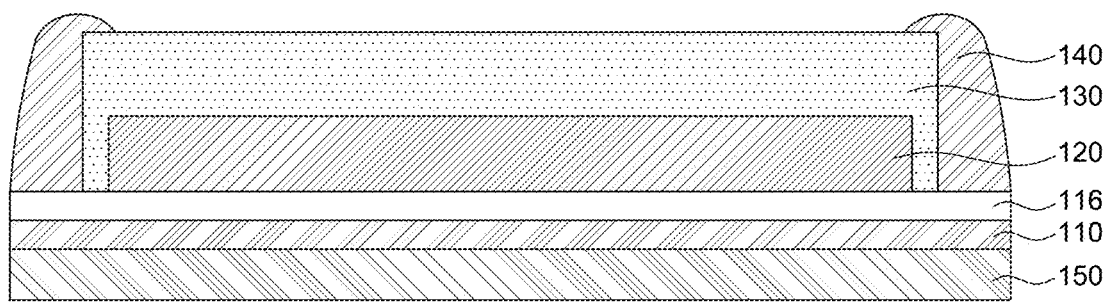
FIG. 2 is a schematic cross-sectional view of a display device according to an exemplary embodiment of the present disclosure.

FIG. 1 is a plan view of a display device according to an exemplary embodiment of the present disclosure. FIG. 2 is a schematic cross-sectional view of a display device according to an exemplary embodiment of the present disclosure. For the convenience of description, in FIG. 1, among various components of the display device 100, only a substrate 110, a plurality of flexible films 160, and a plurality of printed circuit boards 170 are illustrated.

Referring to FIGS. 1 and 2, the substrate 110 is a support member which supports other components of the display device 100. The substrate 110 may be formed of any one of a transparent conducting oxide and an oxide semiconductor. For example, the substrate 110 may be formed of a transparent conducting oxide (TCO), such as indium tin oxide (ITO), indium zinc oxide (IZO), or indium tin zinc oxide (ITZO).

Further, the substrate 110 may be formed of an oxide semiconductor material formed of indium (In) and gallium (Ga), for example, a transparent oxide semiconductor such as indium gallium zinc oxide (IGZO), indium gallium oxide (IGO), and indium tin zinc oxide (ITZO). However, a type of a material of the transparent conducting oxide and the oxide semiconductor is illustrative so that the substrate 110 may be formed by another transparent conducting oxide and oxide semiconductor material which have not been described in the specification but is not limited thereto.

In the meantime, the substrate 110 may be formed by depositing the transparent conducting oxide or an oxide semiconductor with a very thin thickness. Therefore, as the substrate 110 is formed to have a very thin thickness, the substrate has a flexibility. A display device including a substrate 110 having a flexibility may be implemented as a flexible display device 100 which displays an image even in a folded or rolled state. For example, when the display device 100 is a foldable display device, the substrate 110 is folded or unfolded with respect to a folding axis. As another example, when the display device 100 is a rollable display device, the display device may be stored by being rolled around the roller. Accordingly, the display device 100 according to the exemplary embodiment of the present disclosure uses a substrate 110 having a flexibility to be implemented as a flexible display device 100 like a foldable display device or a rollable display device.

Further, the display device 100 according to the exemplary embodiment of the present disclosure uses a substrate 110 formed of a transparent conducting oxide or an oxide semiconductor to perform a LLO process. The LLO process refers to a process of separating a temporary substrate below the substrate 110 and the substrate 110 using laser during the manufacturing process of a display device 100. Accordingly, the substrate 110 is a layer for more easily performing the LLO process so that it is referred to as a functional thin film, a functional thin film layer, or a functional substrate. The LLO process will be described in more detail below.

The substrate 110 includes an active area AA and a non-active area NA.

The active area AA is an area where images are displayed. In the active area AA, a pixel unit 120 configured by a plurality of sub pixels may be disposed to display images. For example, the pixel unit 120 is configured by a plurality of sub pixels including a light emitting diode and a driving circuit to display images.

The non-active area NA is an area where no image is displayed and various wiring lines and driving ICs for driving the sub pixels disposed in the active area AA are disposed. For example, in the non-active area NA, various driving ICs such as a gate driver IC and a data driver IC may be disposed.

The plurality of flexible films 160 is disposed at one end of the substrate 110. The plurality of flexible films 160 is electrically connected to one end of the substrate 110. The plurality of flexible films 160 is films in which various components are disposed on a base film having malleability to supply a signal to the plurality of sub pixels of the active area AA. One ends of the plurality of flexible films 160 are disposed in the non-active area NA of the substrate 110 to supply a data voltage to the plurality of sub pixels of the active area AA. In the meantime, even though the plurality of flexible films 160 is four in FIG. 1, the number of flexible films 160 may vary depending on the design but is not limited thereto.

In the meantime, a driving IC such as a gate driver IC or a data driver IC may be disposed on the plurality of flexible films 160. The driving IC is a component which processes data for displaying images and a driving signal for processing the data. The driving IC may be disposed by a chip on glass (COG), a chip on film (COF), or a tape carrier package (TCP) technique depending on a mounting method. In the present specification, for the convenience of description, it is described that the driving IC is mounted on the plurality of flexible films 160 by a chip on film manner but is not limited thereto.

The printed circuit board 170 is connected to the plurality of flexible films 160. The printed circuit board 170 is a component which supplies signals to the driving IC. Various components may be disposed in the printed circuit board 170 to supply various driving signals such as a driving signal or a data voltage to the driving IC. In the meantime, even though two printed circuit boards 170 are illustrated in FIG. 1, the number of printed circuit boards 170 may vary depending on the design and is not limited thereto.

Referring to FIG. 2, a first inorganic insulating layer 116 is disposed on the substrate 110. The first inorganic insulating layer 116 suppresses moisture and/or oxygen which penetrates from the outside of the substrate 110 from being spread. The moisture permeation characteristic of the display device 100 may be controlled by controlling a thickness or a lamination structure of the first inorganic insulating layer 116. Further, the first inorganic insulating layer 116 may suppress a short defect from being caused when the substrate 110 formed of a transparent conducting oxide or an oxide semiconductor is in contact with the other configurations such as the pixel unit 120. The first inorganic insulating layer 116 may be formed of an inorganic material, for example, may be formed of silicon oxide (SiOx), and may be configured by a single layer or a double layer, but is not limited thereto.

The pixel unit 120 is disposed on the first inorganic insulating layer 116. The pixel unit 120 may be disposed so as to correspond to the active area AA. The pixel unit 120 is a component which includes a plurality of sub pixels to display images. The plurality of sub pixels of the pixel unit 120 is minimum units which configure the active area AA and a light emitting diode and a driving circuit may be disposed in each of the plurality of sub pixels. For example, the light emitting diode of each of the plurality of sub pixels may include an organic light emitting diode including an anode, an organic emission layer, and a cathode or an LED including an N-type and a P-type semiconductor layers and an emission layer. The driving circuit for driving the plurality of sub pixels may include a driving element such as a thin film transistor or a storage capacitor but is not limited thereto. Hereinafter, for the convenience of description, it is assumed that the light emitting diode of each of the plurality of sub pixels is an organic light emitting diode, but it is not limited thereto.

In the meantime, the display device 100 may be configured by a top emission type or a bottom emission type, depending on an emission direction of light which is emitted from the light emitting diode.

According to the top emission type, light emitted from the light emitting diode is emitted to an upper portion of the substrate 110 on which the light emitting diode is disposed. In the case of the top emission type, a reflective layer may be formed below the anode to allow the light emitted from the organic light emitting diode to travel to the upper portion of the substrate 110, that is, toward the cathode.

According to the bottom emission type, light emitted from the light emitting diode is emitted to a lower portion of the substrate 110 on which the light emitting diode is disposed. In the case of the bottom emission type, the anode may be formed only of a transparent conductive material and the cathode may be formed of the metal material having a high reflectance to allow the light emitted from the light emitting diode to travel to the lower portion of the substrate 110.

Hereinafter, for the convenience of description, the description will be made by assuming that the display device 100 according to an exemplary embodiment of the present disclosure is a bottom emission type display device, but it is not limited thereto.

The encapsulation layer 120 is disposed to cover the pixel unit 130. The encapsulation layer 130 seals the pixel unit 120 to protect the light emitting diode of the pixel unit 120 from moisture, oxygen, and impacts of the outside. The encapsulation unit 130 may be configured by thin film encapsulation (TFE) formed by alternately laminating a plurality of inorganic layer and a plurality of organic layers. For example, the inorganic layer may be formed of an inorganic material such as silicon nitride (SiNx), silicon oxide (SiOx), and aluminum oxide (AlOx) and the organic layer may be formed of epoxy or acrylic polymer, but they are not limited thereto. Further, the encapsulation layer 130 may be configured by a face seal type. For example, the encapsulation layer 130 may be formed by forming ultraviolet or thermosetting sealant on the entire surface of the pixel unit 120. However, the structure of the encapsulation layer 130 may be formed by various methods and materials but is not limited thereto.

In the meantime, an encapsulation substrate which has a high modulus and is formed of a metal material having a strong corrosion resistance may be further disposed on the encapsulation layer 130. For example, the encapsulation substrate may be formed of a material having a high modulus of approximately 200 to 900 MPa. The encapsulation substrate may be formed of a metal material, which has a high corrosion resistance and is easily processed in the form of a foil or a thin film, such as aluminum (Al), nickel (Ni), chromium (Cr), iron (Fe), and an alloy material of nickel. Therefore, as the encapsulation substrate 125 is formed of a metal material, the encapsulation substrate 125 may be implemented as an ultra-thin film and provide a strong resistance against external impacts and scratches.

A seal member 140 is disposed so as to enclose side surfaces of the pixel unit 120 and the encapsulation layer 130. The seal member 140 is disposed in the non-active area NA and is disposed to enclose the pixel unit 120 disposed in the active area AA. The seal member 140 is disposed so as to enclose a side surface of the pixel unit 120 and a side surface of the encapsulation layer 130 to minimize the moisture permeation to the pixel unit 120. For example, the seal member 140 may be disposed so as to cover an upper surface of the first inorganic insulating layer 116 which overlaps the non-active area NA and protrudes to the outside of the pixel unit 120, a side surface of the encapsulation layer 130 disposed to enclose the pixel unit 120, and a part of an upper surface of the encapsulation layer 130.

The seal member 140 may be formed of a non-conducting material having an elasticity so as to encapsulate the side surface of the pixel unit 120 and reinforce the rigidity of the side surface of the display device 100. Further, the seal member 140 may be formed of a material having an adhesiveness. The seal member 140 may further include an absorbent which absorbs moisture and oxygen from the outside to minimize the moisture permeation through the side portion of the display device 100. For example, the seal member 140 may be formed of polyimide (PI), poly urethane, epoxy, or acryl based material, but is not limited thereto.

A polarizer 150 is disposed below the substrate 110. The polarizer 150 selectively transmits light to reduce the reflection of external light which is incident onto the substrate 110. Specifically, in the display device 100, various metal materials which are applied to semiconductor devices, wiring lines, and light emitting diodes is formed on the substrate 110. Therefore, the external light incident onto the substrate 110 may be reflected from the metal material so that the visibility of the display device 100 may be reduced due to the reflection of the external light. At this time, the polarizer 150 which suppresses the reflection of external light is disposed below the substrate 110 to increase outdoor visibility of the display device 100. However, the polarizer 150 may be omitted depending on an implementation example of the display device 100.

Even though not illustrated in the drawing, a barrier film may be disposed below the substrate 110 together with the polarizer 150. The barrier film minimizes the permeation of the moisture and oxygen outside the substrate 110 into the substrate 110 to protect the pixel unit 120 including a light emitting diode. However, the barrier film may be omitted depending on an implementation example of the display device 100, but it is not limited thereto.

Hereinafter, the plurality of sub pixels of the pixel unit 120 will be described in more detail with reference to FIGS. 3 to 6.

Figure 3:
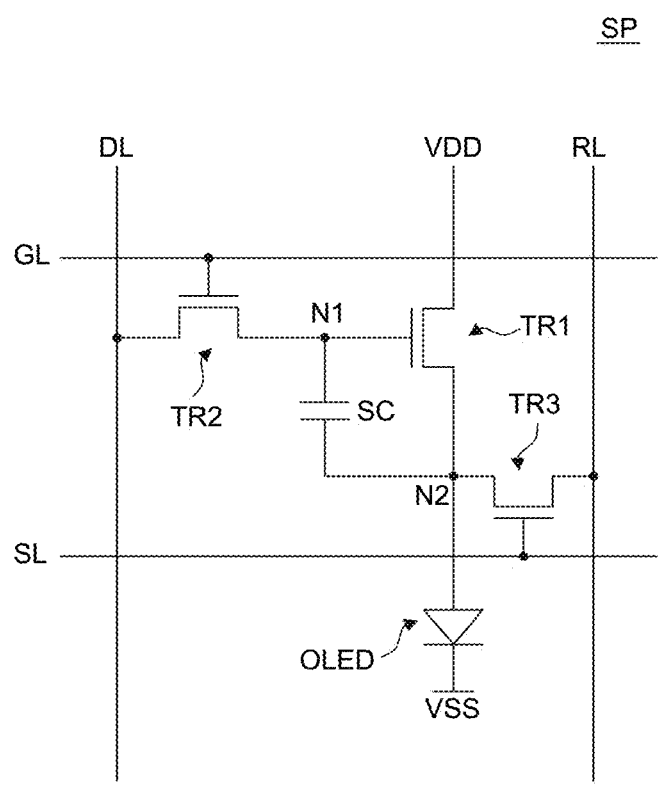
FIG. 3 is a circuit diagram of a sub pixel of a display device according to an exemplary embodiment of the present disclosure.

FIG. 3 is a circuit diagram of a sub pixel of a display device according to an exemplary embodiment of the present disclosure.

Referring to FIG. 3, the driving circuit for driving the light emitting diode OLED of the plurality of sub pixels SP includes a first transistor TR1, a second transistor TR2, a third transistor TR3, and a storage capacitor SC. In order to drive the driving circuit, a plurality of wiring lines including a gate line GL, a data line DL, a high potential power line VDD, a sensing line SL, and a reference line RL is disposed on the substrate 110.

Each of the first transistor TR1, the second transistor TR2, and the third transistor TR3 included in the driving circuit of one sub pixel SP includes a gate electrode, a source electrode, and a drain electrode.

The first transistor TR1, the second transistor TR2, and the third transistor TR3 may be P-type thin film transistors or N-type thin film transistors. For example, since in the P-type thin film transistor, holes flow from the source electrode to the drain electrode, the current flows from the source electrode to the drain electrode. Since in the N-type thin film transistor, electrons flow from the source electrode to the drain electrode, the current flows from the drain electrode to the source electrode. Hereinafter, the description will be made under the assumption that the first transistor TR1, the second transistor TR2, and the third transistor TR3 are N-type thin film transistors in which the current flows from the drain electrode to the source electrode, but the present disclosure is not limited thereto.

The first transistor TR1 includes a first active layer, a first gate electrode, a first source electrode, and a first drain electrode. The first gate electrode is connected to a first node N1, the first source electrode is connected to the anode of the light emitting diode OLED, and the first drain electrode is connected to the high potential power line VDD. When a voltage of the first node N1 is higher than a threshold voltage, the first transistor TR1 is turned on and when the voltage of the first node N1 is lower than the threshold voltage, the first transistor TR1 is turned off. When the first transistor TR1 is turned on, a driving current may be transmitted to the light emitting diode OLED by means of the first transistor TR1. Therefore, the first transistor TR1 which controls the driving current transmitted to the light emitting diode OLED may be referred to as a driving transistor.

The second transistor TR2 includes a second active layer, a second gate electrode, a second source electrode, and a second drain electrode. The second gate electrode is connected to the gate line GL, the second source electrode is connected to the first node N1, and the second drain electrode is connected to the data line DL. The second transistor TR2 may be turned on or off based on a gate voltage from the gate line GL. When the second transistor TR2 is turned on, a data voltage from the data line DL may be charged in the first node N1. Therefore, the second transistor TR2 which is turned on or turned off by the gate line GL may also be referred to as a switching transistor.

The third transistor TR3 includes a third active layer, a third gate electrode, a third source electrode, and a third drain electrode. The third gate electrode is connected to the sensing line SL, the third source electrode is connected to the second node N2, and the third drain electrode is connected to the reference line RL. The third transistor TR3 may be turned on or off based on a sensing voltage from the sensing line SL. When the third transistor TR3 is turned on, a reference voltage from the reference line RL may be transmitted to the second node N2 and the storage capacitor SC. Therefore, the third transistor TR3 may also be referred to as a sensing transistor.

In the meantime, even though in FIG. 3, it is illustrated that the gate line GL and the sensing line SL are separate wiring lines, the gate line GL and the sensing line SL may be implemented as one wiring line, but it is not limited thereto.

The storage capacitor SC is connected between the first gate electrode and the first source electrode of the first transistor TR1. That is, the storage capacitor SC may be connected between the first node N1 and the second node N2. The storage capacitor SC maintains a potential difference between the first gate electrode and the first source electrode of the first transistor TR1 while the light emitting diode OLED emits light, so that a constant driving current may be supplied to the light emitting diode OLED. The storage capacitor SC includes a plurality of capacitor electrodes and for example, one of a plurality of capacitor electrodes is connected to the first node N1 and the other one is connected to the second node N2.

The light emitting diode OLED includes an anode, an emission layer, and a cathode. The anode of the light emitting diode OLED is connected to the second node N2 and the cathode is connected to the low potential power line VSS. The light emitting diode OLED is supplied with a driving current from the first transistor TR1 to emit light.

In the meantime, in FIG. 3, it is described that the driving circuit of the sub pixel SP of the display device 100 according to the exemplary embodiment of the present disclosure has a 3T1C structure including three transistors and one storage capacitor SC. However, the number and a connection relationship of the transistors and the storage capacitor may vary in various ways depending on the design and are not limited thereto.

Figure 4A:
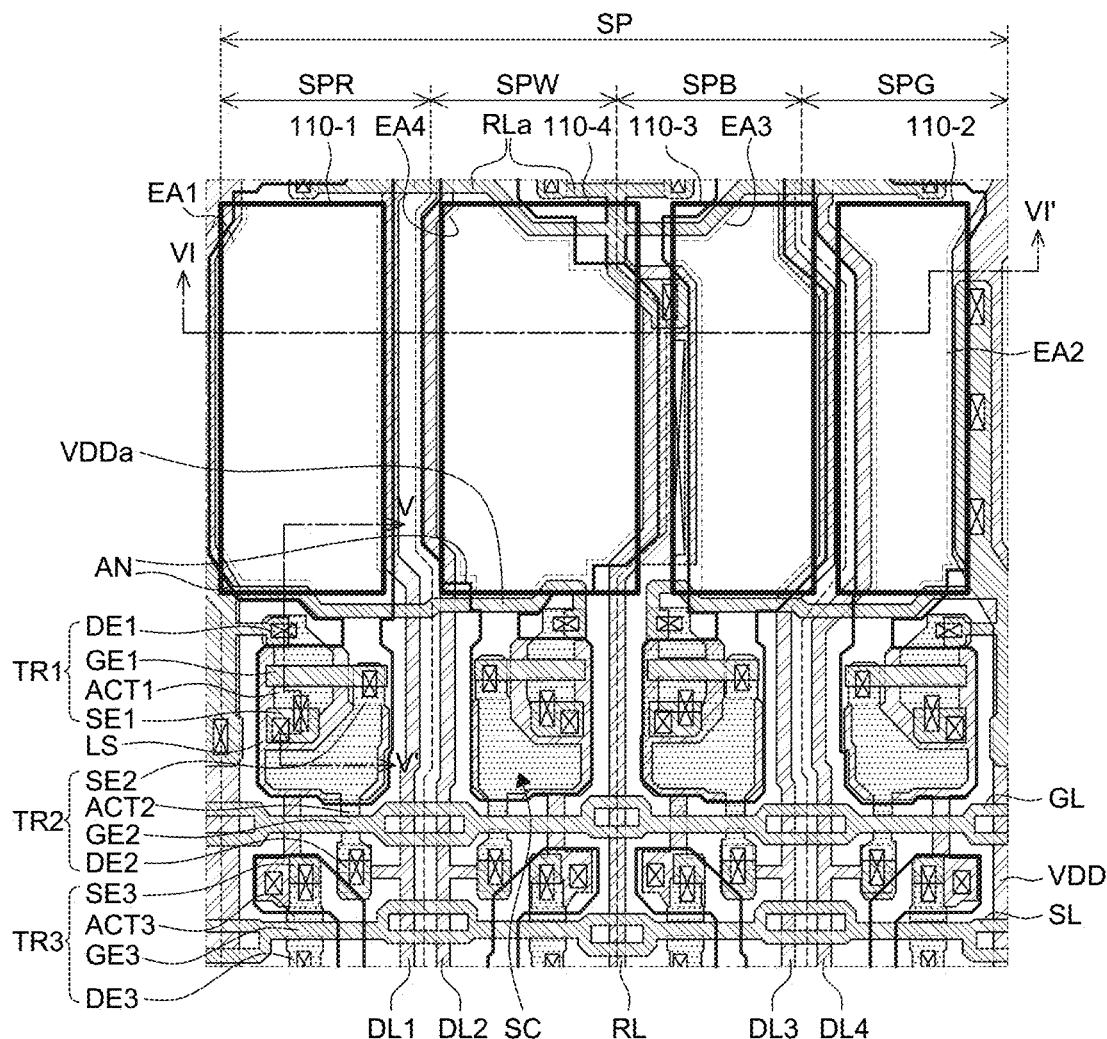
FIG. 4A is an enlarged plan view of a display device according to an exemplary embodiment of the present disclosure.
Figure 4B:
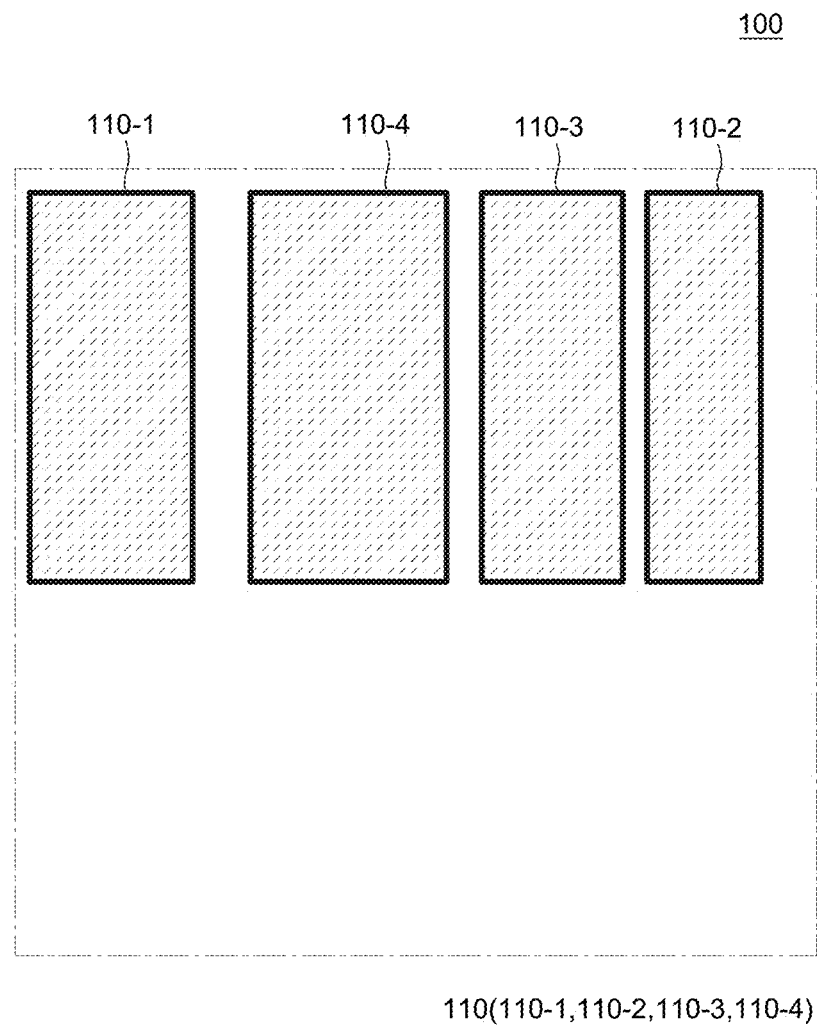
FIG. 4B is a view for explaining a substrate of a display device according to an exemplary embodiment of the present disclosure.
Figure 5:
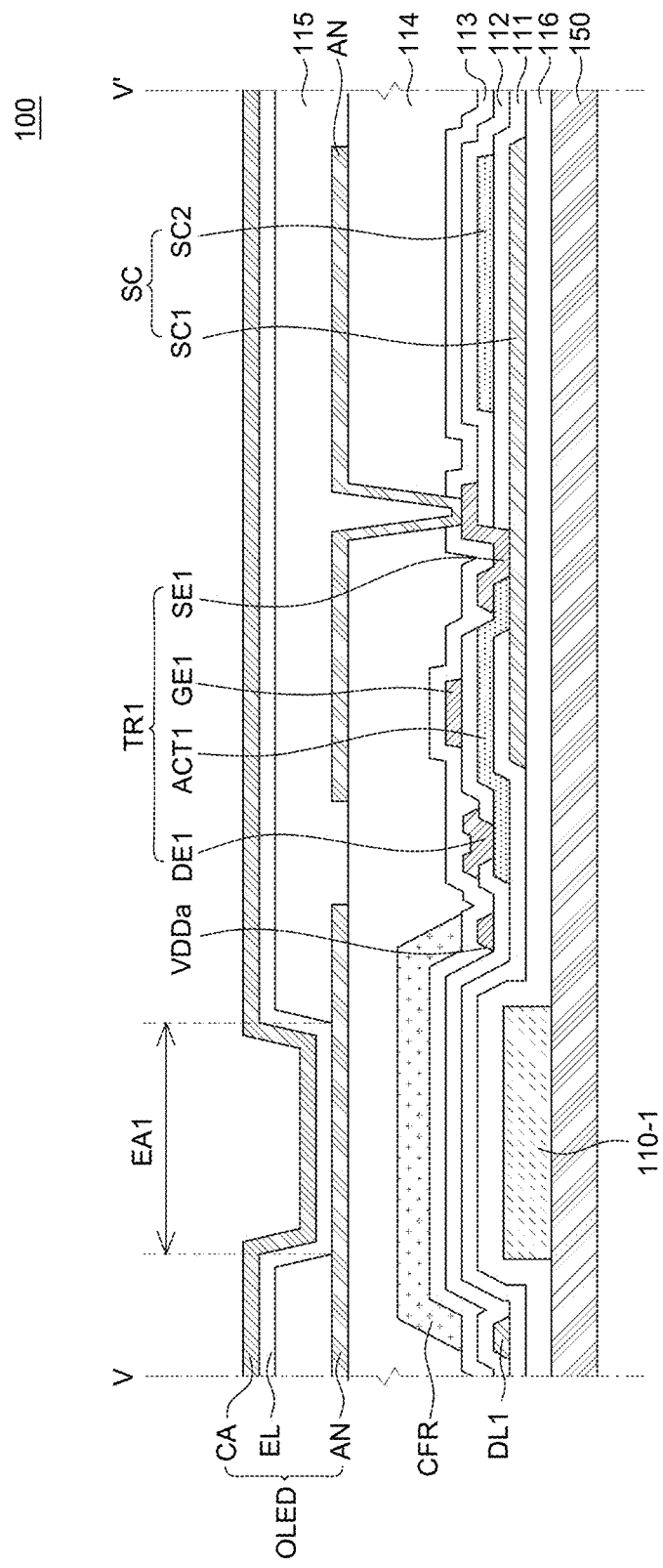
FIG. 5 is a cross-sectional view taken along the line V-V' of FIG. 4A.
Figure 6:
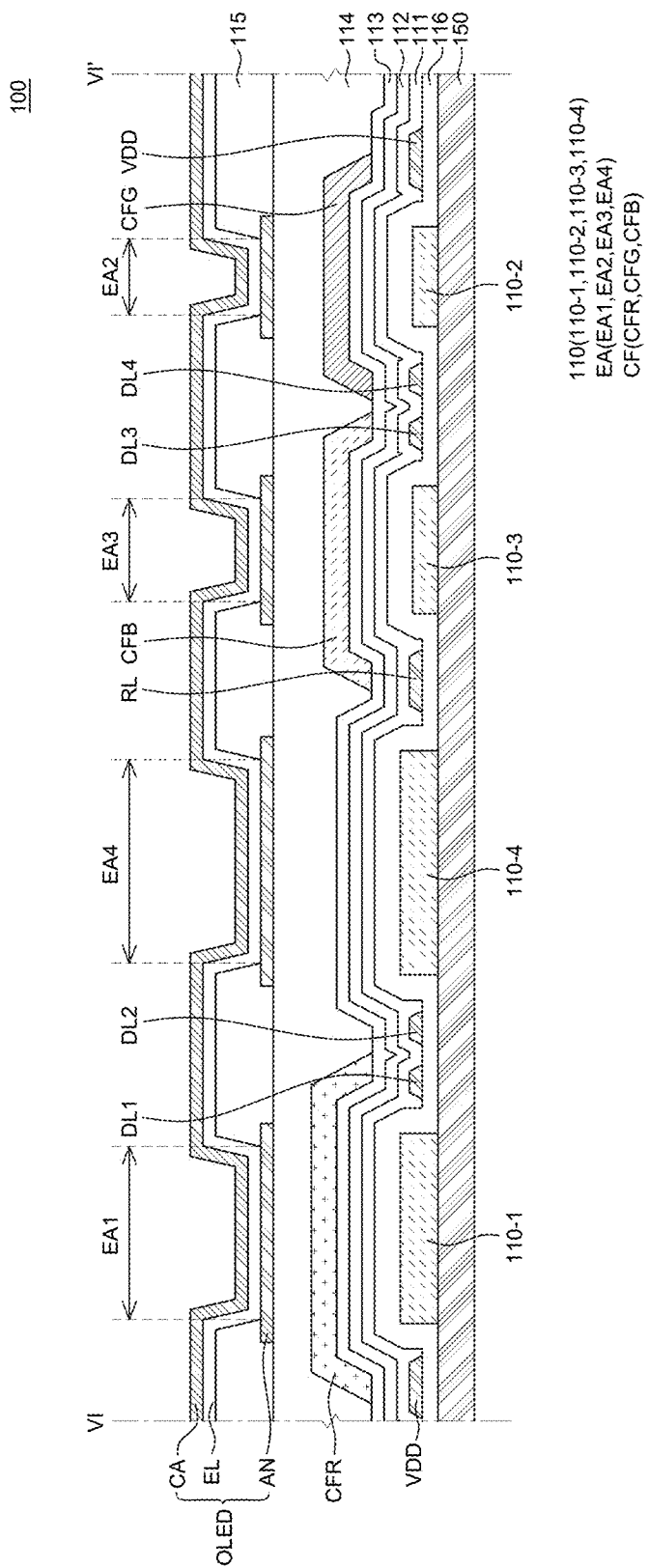
FIG. 6 is a cross-sectional view taken along the line VI-VI' of FIG. 4A.

FIG. 4A is an enlarged plan view of a display device according to an exemplary embodiment of the present disclosure and FIG. 4B is a view for explaining a substrate of a display device according to an exemplary embodiment of the present disclosure. FIG. 5 is a cross-sectional view taken along the line V-V' of FIG. 4A. FIG. 6 is a cross-sectional view taken along the line VI-VI' of FIG. 4A. FIG. 4A is an enlarged plan view of a red sub pixel SPR, a white sub pixel SPW, a blue sub pixel SPB, and a green sub pixel SPG which configure one pixel. In FIG. 4A, for the convenience of description, the color filter CF and the bank 115 are not illustrated and an edge of the substrate 110 is illustrated with a bold solid line. In FIG. 4B, for the convenience of description, among components of the display device 100, only a substrate 110 is illustrated.

Referring to FIGS. 4A to 6, the display device 100 according to the exemplary embodiment of the present disclosure includes a substrate 110, a first inorganic insulating layer 116, a buffer layer 111, a gate insulating layer 112, a passivation layer 113, a planarization layer 114, a bank 115, a first transistor TR1, a second transistor TR2, a third transistor TR3, a storage capacitor SC, a light emitting diode OLED, a gate line GL, a sensing line SL, a data line DL, a reference line RL, a high potential power line VDD, and a plurality of color filters CF.

Referring to FIG. 4A, the plurality of sub pixels SP includes a red sub pixel SPR which is a first sub pixel, a green sub pixel SPG which is a second sub pixel, a blue sub pixel SPB which is a third sub pixel, and a white sub pixel SPW which is a fourth sub pixel. For example, the red sub pixel SPR, the white sub pixel SPW, the blue sub pixel SPB, and the green sub pixel SPG may be sequentially disposed along a row direction. However, the placement order of the plurality of sub pixels SP is not limited thereto.

Each of the plurality of sub pixels SP includes an emission area EA and a circuit area. The emission area EA is an area where one color light is independently emitted and the light emitting diode OLED may be disposed therein. Specifically, an area in which the plurality of color filters CF and the anode AN overlap, an area which is exposed from the bank 115 to allow light emitted from the light emitting diode OLED to travel to the outside is defined as an emission area EA. For example, referring to FIGS. 4A and 6, a first emission area EA1 which is an emission area EA of the red sub pixel SPR is an area exposed from the bank 115 in an area in which the red color filter CFR and the anode AN overlap. A second emission area EA2 which is an emission area EA of the green sub pixel SPG is an area exposed from the bank 115 in an area in which the green color filter CFG and the anode AN overlap. A third emission area EA3 which is an emission area EA of the blue sub pixel SPB is an area exposed from the bank 115 in an area in which the blue color filter CFB and the anode AN overlap. At this time, a fourth emission area EA4 which is an emission area EA of the white sub pixel SPW in which a separate color filter CF is not disposed may be a white emission area which emits white light, in an area overlapping a part of the anode AN exposed from the bank 115.

Referring to FIGS. 4A to 6, areas of the emission areas EA in the plurality of sub pixels SP are reduced in the order of an emission area of the white sub pixel SPW which is the fourth sub pixel, an emission area of the red sub pixel SPR which is the first sub pixel, an emission area of the blue sub pixel SPB which is the third sub pixel, and an emission area of the green sub pixel SPG which is the second sub pixel. That is, the area of the fourth emission area EA4 which is an emission area EA of the white sub pixel SPW which is the fourth sub pixel is larger than the area of the first emission area EA1 which is an emission area EA of the red sub pixel SPR which is the first sub pixel. The area of the first emission area EA1 which is an emission area EA of the red sub pixel SPR which is the first sub pixel is larger than the area of the third emission area EA3 which is an emission area of the blue sub pixel SPB which is the third sub pixel. The area of the third emission area EA3 which is an emission area of the blue sub pixel SPB which is the third sub pixel is larger than the area of the second emission area EA2 which is an emission area EA of the green sub pixel SPG which is the second sub pixel. The order of the areas of the emission areas EA of the sub pixels SP may vary depending on the design.

Referring to FIGS. 4A to 6, the substrate 110 includes a plurality of substrate patterns 110-1, 110-2, 110-3, and 110-4. The plurality of substrate patterns 110-1, 110-2, 110-3, and 110-4 includes a first substrate pattern 110-1, a second substrate pattern 110-2, a third substrate pattern 110-3 and a fourth substrate pattern 110-4. The first substrate pattern 110-1 corresponds to the first sub pixel SPR, the second substrate pattern 110-2 corresponds to the second sub pixel SPG, the third substrate pattern 110-3 corresponds to the third sub pixel SPB, and the fourth substrate pattern 110-4 corresponds to the fourth sub pixel SPW.

Referring to FIGS. 4A and 4B, the plurality of substrate patterns 110-1, 110-2, 110-3, and 110-4 is disposed so as to correspond to the emission areas EA of the plurality of sub pixels SP. Therefore, the plurality of substrate patterns 110-1, 110-2, 110-3, and 110-4 is disposed so as to overlap the emission areas EA of the plurality of sub pixels SP. At this time, the plurality of substrate patterns 110-1, 110-2, 110-3, and 110-4 has a rectangle shape corresponding to the emission area EA of each of the plurality of sub pixels SP. Therefore, the plurality of substrate patterns 110-1, 110-2, 110-3, and 110-4 may be larger than areas of the emission areas EA of the plurality of sub pixels SP.

Referring to FIGS. 4A to 6, two of the first substrate pattern 110-1, the second substrate pattern 110-2, the third substrate pattern 110-3, and the fourth substrate pattern 110-4 of the plurality of substrate patterns 110-1, 110-2, 110-3, and 110-4 have the same thickness and the other two substrate patterns have the same thickness. That is, as illustrated in FIG. 6, the thicknesses of the first substrate patterns 110-1 and the fourth substrate pattern 110-4 are the same and the thicknesses of the second substrate patterns 110-2 and the third substrate pattern 110-3 are the same.

At this time, the area of the first emission area EA1 which is the emission area EA of the red sub pixel SPR in which the first substrate pattern 110-1 is disposed and the area of the fourth emission area EA4 which is the emission area EA of the white sub pixel SPW in which the fourth substrate pattern 110-4 is disposed are larger than the area of the second emission area EA2 which is the emission area EA of the green sub pixel SPG in which the second substrate pattern 110-2 is disposed and the area of the third emission area EA3 which is the emission area EA of the blue sub pixel SPB in which the third substrate pattern 110-3 is disposed. Therefore, the thickness of the first substrate pattern 110-1 and the thickness of the fourth substrate pattern 110-4 which are disposed in the first emission area EA1 and the fourth emission area EA4 having a relatively larger area are equal to each other. Further, the thickness of the second substrate pattern 110-2 and the thickness of the third substrate pattern 110-3 which are disposed in the second emission area EA2 and the third emission area EA3 having a relatively smaller area are equal to each other. However, the thickness of the first substrate pattern 110-1 and the thickness of the fourth substrate pattern 110-4 may be larger than the thickness of the second substrate pattern 110-2 and the thickness of the third substrate pattern 110-3.

Referring to FIGS. 3 to 5, the first inorganic insulating layer 116 is disposed on the substrate 110 and the plurality of high potential power line VDD, the plurality of data lines DL, the plurality of reference lines RL, and the light shielding layer LS are disposed on the first inorganic insulating layer 116.

The plurality of high potential power lines VDD, the plurality of data lines DL, the plurality of reference lines RL, and the light shielding layer LS are disposed on the same layer of the substrate 110 and formed of the same conductive material. For example, the plurality of high potential power lines VDD, the plurality of data lines DL, the plurality of reference lines RL, and the light shielding layer LS may be configured by a conductive material such as copper (Cu), aluminum (Al), molybdenum (Mo), nickel (Ni), titanium (Ti), chrome (Cr), or an alloy thereof, but are not limited thereto.

The plurality of high potential power lines VDD is wiring lines which transmit the high potential power signal to each of the plurality of sub pixels SP. The plurality of high potential power lines VDD extends between the plurality of sub pixels SP in a column direction and two sub pixels SP which are adjacent to each other in the row direction may share one high potential power line VDD among the plurality of high potential power lines VDD. For example, one high potential power line VDD is disposed at a left side of the red sub pixel SPR to supply a high potential power voltage to the first transistor TR1 of each of the red sub pixel SPR and the white sub pixel SPW. The other high potential power line VDD is disposed at a right side of the green sub pixel SPG to supply a high potential power voltage to the first transistor TR1 of each of the blue sub pixel SPB and the green sub pixel SPG.

The plurality of data lines DL is lines which extend between the plurality of sub pixels SP in a column direction to transmit a data voltage to each of the plurality of sub pixels SP and includes a first data line DL1, a second data line DL2, a third data line DL3, and a fourth data line DL4. The first data line DL1 is disposed between the red sub pixel SPR and the white sub pixel SPW to transmit a data voltage to the second transistor TR2 of the red sub pixel SPR. The second data line DL2 is disposed between the first data line DL1 and the white sub pixel SPW to transmit the data voltage to the second transistor TR2 of the white sub pixel SPW. The third data line DL3 is disposed between the blue sub pixel SPB and the green sub pixel SPG to transmit a data voltage to the second transistor TR2 of the blue sub pixel SPB. The fourth data line DL4 is disposed between the third data line DL3 and the green sub pixel SPG to transmit the data voltage to the second transistor TR2 of the green sub pixel SPG.

The plurality of reference lines RL extends between the plurality of sub pixels SP in the column direction to transmit a reference voltage to each of the plurality of sub pixels SP. The plurality of sub pixels SP which forms one pixel may share one reference line RL. For example, one reference line RL is disposed between the white sub pixel SPW and the blue sub pixel SPB to transmit a reference voltage to a third transistor TR3 of each of the red sub pixel SPR, the white sub pixel SPW, the blue sub pixel SPB, and the green sub pixel SPG.

Referring to FIGS. 4A and 5, the light shielding layer LS is disposed on the first inorganic insulating layer 116. The light shielding layer LS is disposed so as to overlap the first active layer ACT1 of at least the first transistor TR1 among the plurality of transistors TR1, TR2, and TR3 to block light incident onto the first active layer ACT1. If light is irradiated onto the first active layer ACT1, a leakage current is generated so that the reliability of the first transistor TR1 which is a driving transistor may be degraded. At this time, if the light shielding layer LS configured by an opaque conductive material, such as copper (Cu), aluminum (Al), molybdenum (Mo), nickel (Ni), titanium (Ti), chrome (Cr), or an alloy thereof, is disposed so as to overlap the first active layer ACT1, light incident from the lower portion of the substrate 110 onto the first active layer ACT may be blocked. Accordingly, the reliability of the first transistor TR1 may be improved. However, it is not limited thereto and the light shielding layer LS may be disposed so as to overlap the second active layer ACT2 of the second transistor TR2 and the third active layer ACT3 of the third transistor TR3.

In the meantime, even though in the drawing, it is illustrated that the light single layer LS is a single layer, the light shielding layer LS may be formed as a plurality of layers. For example, the light shielding layer LS may be formed of a plurality of layers disposed so as to overlap each other with at least one of the first inorganic insulating layer 116, the buffer layer 111, the gate insulating layer 112, and the passivation layer 113 therebetween.

The buffer layer 111 is disposed on the plurality of high potential power lines VDD, the plurality of data lines DL, the plurality of reference lines RL, and the light shielding layer LS. The buffer layer 111 may reduce permeation of moisture or impurities through the substrate 110. For example, the buffer layer 111 may be configured by a single layer or a double layer of silicon oxide SiOx or silicon nitride SiNx but is not limited thereto. Further, the buffer layer 111 may be omitted depending on a type of substrate 110 or a type of transistor but is not limited thereto.

In each of the plurality of sub pixels SP, the first transistor TR1, the second transistor TR2, the third transistor TR3, and the storage capacitor SC are disposed on the buffer layer 111.

First, the first transistor TR1 includes a first active layer ACT1, a first gate electrode GE1, a first source electrode SE1, and a first drain electrode DE1.

The first active layer ACT1 is disposed on the buffer layer 111. The first active layer ACT1 may be formed of a semiconductor material such as an oxide semiconductor, amorphous silicon, or polysilicon, but is not limited thereto. For example, when the first active layer ACT1 is formed of an oxide semiconductor, the first active layer ACT1 is formed by a channel region, a source region, and a drain region and the source region and the drain region may be conductive regions but are not limited thereto.

The gate insulating layer 112 is disposed on the first active layer ACT1. The gate insulating layer 112 is a layer for electrically insulating the first gate electrode GE1 from the first active layer ACT1 and may be formed of an insulating material. For example, the gate insulating layer 112 may be configured by a single layer or a double layer of silicon oxide SiOx or silicon nitride SiNx but is not limited thereto.

The first gate electrode GE1 is disposed on the gate insulating layer 112 so as to overlap the first active layer ACT1. The first gate electrode GE1 may be configured by a conductive material, such as copper (Cu), aluminum (Al), molybdenum (Mo), nickel (Ni), titanium (Ti), chrome (Cr), or an alloy thereof, but is not limited thereto.

A first source electrode SE1 and a first drain electrode DE1 which are spaced apart from each other are disposed on the gate insulating layer 112. The first source electrode SE1 and the first drain electrode DE1 may be electrically connected to the first active layer ACT1 through a contact hole formed on the gate insulating layer 112. The first source electrode SE1 and the first drain electrode DE1 may be disposed on the same layer as the first gate electrode GE1 to be formed of the same conductive material but is not limited thereto. For example, the first source electrode SE1 and the first drain electrode DE1 may be configured by copper (Cu), aluminum (Al), molybdenum (Mo), nickel (Ni), titanium (Ti), chrome (Cr), or an alloy thereof, but is not limited thereto.

The first drain electrode DE1 is electrically connected to the high potential power lines VDD. For example, the first drain electrodes DE1 of the red sub pixel SPR and the white sub pixel SPW may be electrically connected to the high potential power line VDD at the left side of the red sub pixel SPR. The first drain electrodes DE1 of the blue sub pixel SPB and the green sub pixel SPG may be electrically connected to the high potential power line VDD at the right side of the green sub pixel SPR.

At this time, an auxiliary high potential power line VDDa may be further disposed to electrically connect the first drain electrode DE1 with the high potential power line VDD. One end of the auxiliary high potential power line VDDa is electrically connected to the high potential power line VDD and the other end is electrically connected to the first drain electrode DE1 of each of the plurality of sub pixels SP. For example, when the auxiliary high potential power line VDDa is formed of the same material on the same layer as the first drain electrode DE1, one end of the auxiliary high potential power line VDDa is electrically connected to the high potential power line VDD through a contact hole formed in the gate insulating layer 112 and the buffer layer 111. The other end of the auxiliary high potential power line VDDa extends to the first drain electrode DE1 to be integrally formed with the first drain electrode DE1.

At this time, the first drain electrode DE1 of the red sub pixel SPR and the first drain electrode DE1 of the white sub pixel SPW which are electrically connected to the same high potential power lines VDD may be connected to the same auxiliary high potential power line VDDa. The first drain electrode DE1 of the blue sub pixel SPB and the first drain electrode DE1 of the green sub pixel SPG may also be connected to the same auxiliary high potential power line VDDa. However, the first drain electrode DE1 and the high potential power line VDD may be electrically connected by another method, but it is not limited thereto.

The first source electrode SE1 may be electrically connected to the light shielding layer LS through a contact hole formed on the gate insulating layer 112 and the buffer layer 111. Further, a part of the first active layer ACT1 connected to the first source electrode SE1 may be electrically connected to the light shielding layer LS through a contact hole formed on and the buffer layer 111. If the light shielding layer LS is floated, a threshold voltage of the first transistor TR1 varies to affect the driving of the display device 100. Accordingly, the light shielding layer LS is electrically connected to the first source electrode SE1 to apply a voltage to the light shielding layer LS and it does not affect the driving of the first transistor TR1. However, in the present specification, even though it has been described that both the first active layer ACT1 and the first source electrode SE1 are in contact with the light shielding layer LS, only any one of the first source electrode SE1 and the first active layer ACT1 may be in direct contact with the light shielding layer LS. However, it is not limited thereto.

In the meantime, even though in FIG. 5, it is illustrated that the gate insulating layer 112 is formed on the entire substrate 110, the gate insulating layer 112 may be patterned so as to overlap only the first gate electrode GE1, the first source electrode SE1, and the first drain electrode DE1, but is not limited thereto.

The second transistor TR2 includes a second active layer ACT2, a second gate electrode GE2, a second source electrode SE2, and a second drain electrode DE2.

The second active layer ACT2 is disposed on the buffer layer 111. The second active layer ACT2 may be formed of a semiconductor material such as an oxide semiconductor, amorphous silicon, or polysilicon, but is not limited thereto. For example, when the second active layer ACT2 is formed of an oxide semiconductor, the second active layer ACT2 may be formed by a channel region, a source region, and a drain region and the source region and the drain region may be conductive regions but are not limited thereto.

The second source electrode SE2 is disposed on the buffer layer 111. The second source electrode SE2 may be integrally formed with the second active layer ACT2 to be electrically connected to each other. For example, the semiconductor material is formed on the buffer layer 111 and a part of the semiconductor material is conducted to form the second source electrode SE2. Therefore, a part of the semiconductor material which is not conducted may become a second active layer ACT2 and a conducted part becomes a second source electrode SE2. However, the second active layer ACT2 and the second source electrode SE2 are separately formed, but it is not limited thereto.

The second source electrode SE2 is electrically connected to the first gate electrode GE1 of the first transistor TR1. The first gate electrode GE1 may be electrically connected to the second source electrode SE2 through a contact hole formed on the gate insulating layer 112. Accordingly, the first transistor TR1 may be turned on or turned off by a signal from the second transistor TR2.

The gate insulating layer 112 is disposed on the second active layer ACT2 and the second source electrode SE2 and the second drain electrode DE2 and the second gate electrode GE2 are disposed on the gate insulating layer 112.

The second gate electrode GE2 is disposed on the gate insulating layer 112 so as to overlap the second active layer ACT2. The second gate electrode GE2 may be electrically connected to the gate line GL and the second transistor TR2 may be turned on or turned off based on the gate voltage transmitted to the second gate electrode GE2. The second gate electrode GE2 may be configured by a conductive material such as copper (Cu), aluminum (Al), molybdenum (Mo), nickel (Ni), titanium (Ti), chrome (Cr), or an alloy thereof, but is not limited thereto.

In the meantime, the second gate electrode GE2 extends from the gate line GL. That is, the second gate electrode GE2 is integrally formed with the gate line GL and the second gate electrode GE2 and the gate line GL may be formed of the same material. For example, the gate line GL may be configured by copper (Cu), aluminum (Al), molybdenum (Mo), nickel (Ni), titanium (Ti), chrome (Cr), or an alloy thereof, but is not limited thereto.

The gate line GL is a wiring line which transmits the gate voltage to each of the plurality of sub pixels SP and intersects the circuit area of the plurality of sub pixels SP to extend in the row direction. The gate line GL extends in the row direction to intersect the plurality of high potential power lines VDD, the plurality of data lines DL, and the plurality of reference lines RL extending in the column direction.

The second drain electrode DE2 is disposed on the gate insulating layer 112. The second drain electrode DE2 is electrically connected to the second active layer ACT2 through a contact hole formed in the gate insulating layer 112 and is electrically connected to one of the plurality of data lines DL through a contact hole formed in the gate insulating layer 112 and the buffer layer 111, simultaneously. For example, the second drain electrode DE2 of the red sub pixel SPR is electrically connected to the first data line DL1 and the second drain electrode DE2 of the white sub pixel SPW is electrically connected to the second data line DL2. For example, the second drain electrode DE2 of the blue sub pixel SPB is electrically connected to the third data line DL3 and the second drain electrode DE2 of the green sub pixel SPG is electrically connected to the fourth data line DL4. The second drain electrode DE2 may be configured by a conductive material, such as copper (Cu), aluminum (Al), molybdenum (Mo), nickel (Ni), titanium (Ti), chrome (Cr), or an alloy thereof, but is not limited thereto.

The third transistor TR3 includes a third active layer ACT3, a third gate electrode GE3, a third source electrode SE3, and a third drain electrode DE3.

The third active layer ACT3 is disposed on the buffer layer 111. The third active layer ACT3 may be formed of a semiconductor material, such as an oxide semiconductor, amorphous silicon, or polysilicon, but is not limited thereto. For example, when the third active layer ACT3 is formed of an oxide semiconductor, the third active layer ACT3 is formed by a channel region, a source region, and a drain region and the source region and the drain region may be conductive regions but are not limited thereto.

The gate insulating layer 112 is disposed on the third active layer ACT3 and the third gate electrode GE3, the third source electrode SE3, and the third drain electrode DE3 are disposed on the gate insulating layer 112.

The third gate electrode GE3 is disposed on the gate insulating layer 112 so as to overlap the third active layer ACT3. The third gate electrode GE3 is electrically connected to the sensing line SL and the third transistor TR3 may be turned on or turned off based on the sensing voltage transmitted to the third transistor TR3. The third gate electrode GE3 may be configured by a conductive material, such as copper (Cu), aluminum (Al), molybdenum (Mo), nickel (Ni), titanium (Ti), chrome (Cr), or an alloy thereof, but is not limited thereto.

In the meantime, the third gate electrode GE3 extends from the sensing line SL. That is, the third gate electrode GE3 is integrally formed with the sensing line SL and the third gate electrode GE3 and the sensing line SL may be formed of the same conductive material. For example, the sensing line SL may be configured by copper (Cu), aluminum (Al), molybdenum (Mo), nickel (Ni), titanium (Ti), chrome (Cr), or an alloy thereof, but is not limited thereto.

The sensing line SL transmits a sensing voltage to each of the plurality of sub pixels SP and extends between the plurality of sub pixels SP in a row direction. For example, the sensing line SL extends at a boundary between the plurality of sub pixels SP in the row direction to intersect the plurality of high potential power lines VDD, the plurality of data lines DL, and the plurality of reference lines RL extending in the column direction.

The third source electrode SE3 may be electrically connected to the third active layer ACT3 through a contact hole formed on the gate insulating layer 112. The third source electrode SE3 may be configured by a conductive material such as copper (Cu), aluminum (Al), molybdenum (Mo), nickel (Ni), titanium (Ti), chrome (Cr), or an alloy thereof, but is not limited thereto.

Further, a part of the third active layer ACT3 which is in contact with the third source electrode SE3 may be electrically connected to the light shielding layer LS through a contact hole formed in the buffer layer 111. That is, the third source electrode SE3 may be electrically connected to the light shielding layer LS with the third active layer ACT3 therebetween. Therefore, the third source electrode SE3 and the first source electrode SE1 may be electrically connected to each other by means of the light shielding layer LS.

The third drain electrode DE3 may be electrically connected to the third active layer ACT3 through a contact hole formed on the gate insulating layer 112. The third drain electrode DE3 may be configured by a conductive material such as copper (Cu), aluminum (Al), molybdenum (Mo), nickel (Ni), titanium (Ti), chrome (Cr), or an alloy thereof, but is not limited thereto.

The third drain electrode DE3 is electrically connected to the reference line RL. For example, the third drain electrodes DE3 of the red sub pixel SPR, the white sub pixel SPW, the blue sub pixel SPB, and the green sub pixel SPG may be electrically connected to the same reference line RL. That is, the plurality of sub pixels SP which forms one pixel may share one reference line RL.

At this time, an auxiliary reference line RLa may be disposed to transmit the reference line RL extending in the column direction to the plurality of sub pixels SP which is disposed in parallel along the row direction. The auxiliary reference line RLa extends in the row direction to electrically connect the reference line RL and the third drain electrode DE3 of each of the plurality of sub pixels SP. One end of the auxiliary reference line RLa is electrically connected to the reference line RL through a contact hole formed in the buffer layer 111 and the gate insulating layer 112. The other end of the auxiliary reference line RLa is electrically connected to the third drain electrode DE3 of each of the plurality of sub pixels SP. In this case, the auxiliary reference line RLa is integrally formed with the third drain electrode DE3 of each of the plurality of sub pixels SP and a reference voltage from the reference line RL is transmitted to the third drain electrode DE3 by means of the auxiliary reference line RLa. However, the auxiliary reference line RLa may be separately formed from the third drain electrode DE3 but is not limited thereto.

The storage capacitor SC is disposed in the circuit area of the plurality of sub pixels SP. The storage capacitor SC may store a voltage between the first gate electrode GE1 and the first source electrode SE1 of the first transistor TR1 to allow the light emitting diode OLED to continuously maintain a constant state for one frame. The storage capacitor SC includes a first capacitor electrode SC1 and a second capacitor electrode SC2.

In each of the plurality of sub pixels SP, the first capacitor electrode SC1 is disposed between the first inorganic insulating layer 116 and the buffer layer 111. The first capacitor electrode SC1 may be disposed to be the closest to the substrate 110 among the conductive components disposed on the substrate 110. The first capacitor electrode SC1 is integrally formed with the light shielding layer LS and is electrically connected to the first source electrode SE1 by means of the light shielding layer LS.

The buffer layer 111 is disposed on the first capacitor electrode SC1 and the second capacitor electrode SC2 is disposed on the buffer layer 111. The second capacitor electrode SC2 may be disposed so as to overlap the first capacitor electrode SC1. The second capacitor electrode SC2 is integrally formed with the second source electrode SE2 to be electrically connected to the second source electrode SE2 and the first gate electrode GE1. For example, the semiconductor material is formed on the buffer layer 111 and a part of the semiconductor material is conducted to form the second source electrode SE2 and the second capacitor electrode SC2. Accordingly, a part of the semiconductor material which is not conducted functions as a second active layer ACT2 and the conducted part functions as a second source electrode SE2 and the second capacitor electrode SC2. As described above, the first gate electrode GE1 is electrically connected to the second source electrode SE2 through the contact hole formed in the gate insulating layer 112. Accordingly, the second capacitor electrode SC2 is integrally formed with the second source electrode SE2 to be electrically connected to the second source electrode SE2 and the first gate electrode GE1.

In summary, the first capacitor electrode SC1 of the storage capacitor SC is integrally formed with the light shielding layer LS to be electrically connected to the light shielding layer LS, the first source electrode SE1, and the third source electrode SE3. Accordingly, the second capacitor electrode SC2 is integrally formed with the second source electrode SE2 and the active layer ACT2 to be electrically connected to the second source electrode SE2 and the first gate electrode GE1. Accordingly, the first capacitor electrode SC1 and the second capacitor electrode SC2 which overlap with the buffer layer 111 therebetween constantly maintain the voltage of the first gate electrode GE1 and the first source electrode SE1 of the first transistor TR1 to maintain the constant state of the light emitting diode OLED.

The passivation layer 113 is disposed on the first transistor TR1, the second transistor TR2, the third transistor TR3, and the storage capacitor SC. The passivation layer 113 is an insulating layer for protecting components below the passivation layer 113. For example, the passivation layer 113 may be configured by a single layer or a double layer of silicon oxide SiOx or silicon nitride SiNx, but is not limited thereto. Further, the passivation layer 113 may be omitted depending on the exemplary embodiment.

A plurality of color filters CF may be disposed in the emission area of each of the plurality of sub pixels SP on the passivation layer 113. As described above, the display device 100 according to the exemplary embodiment of the present disclosure is a bottom emission type in which light emitted from the light emitting diode OLED is directed to the lower portion of the light emitting diode OLED and the substrate 110. Therefore, the plurality of color filters CF may be disposed below the light emitting diode OLED. Light emitted from the light emitting diode OLED passes through the plurality of color filters CF and implemented as various colors of light.

The plurality of color filters CF may include a red color filter CFR, a blue color filter CFB, and a green color filter CFG. The red color filter CFR is disposed in an emission area EA of a red sub pixel SPR of the plurality of sub pixels SP, the blue color filter CFB is disposed in an emission area EA of the blue sub pixel SPB, and the green color filter CFG is disposed in an emission area EA of the green sub pixel SPG.

The planarization layer 114 is disposed on the passivation layer 113. The planarization layer 114 is an insulating layer which planarizes an upper portion of the substrate 110 on which the first transistor TR1, the second transistor TR2, the third transistor TR3, the storage capacitor SC, the plurality of high potential power lines VDD, the plurality of data lines DL, the plurality of reference lines RL, the plurality of gate lines GL, and the plurality of sensing lines SL are disposed. The planarization layer 114 may be formed of an organic material, and for example, may be configured by a single layer or a double layer of polyimide or photo acryl, but is not limited thereto.

The light emitting diode ED is disposed in the emission area EA of each of the plurality of sub pixels SP. The light emitting diode OLED is disposed on the planarization layer 114 in each of the plurality of sub pixels SP. The light emitting diode OLED includes an anode AN, an emission layer EL, and a cathode CA.

The anode AN is disposed on the planarization layer 114 in the emission area. The anode AN supplies holes to the emission layer EL so that the anode may be formed of a conductive material having a high work function. For example, the anode AN may be formed of a transparent conductive material such as indium tin oxide (ITO) and indium zinc oxide (IZO) but is not limited thereto.

In the meantime, the anode AN extends toward the circuit area. A part of the anode AN extends toward the first source electrode SE1 of the circuit area from the emission area EA and is electrically connected to the first source electrode SE1 through a contact hole formed in the planarization layer 114 and the passivation layer 113. Accordingly, the anode AN of the light emitting diode OLED extends to the circuit area to be electrically connected to the first source electrode SE1 of the first transistor TR1 and the second capacitor electrode SC2 of the storage capacitor SC.

In the emission area EA and the circuit area, the emission layer EL is disposed on the anode AN. The emission layer EL may be formed as one layer over the plurality of sub pixels SP. That is, the emission layers EL of the plurality of sub pixels SP are connected to each other to be integrally formed. The emission layer EL may be configured by one emission layer or may have a structure in which a plurality of emission layers which emits different color light is laminated. The emission layer EL may further include an organic layer such as a hole injection layer, a hole transport layer, an electron transport layer, and an electron injection layer.

The cathode CA is disposed on the emission layer EL in the emission area EA and the circuit area. The cathode CA supplies electrons to the emission layer EL so that the cathode may be formed of a conductive material having a low work function. The cathode CA may be formed as one layer over the plurality of sub pixels SP. That is, the cathodes CA of the plurality of sub pixels SP are connected to be integrally formed. For example, the cathode CA may be formed of a transparent conductive material such as indium tin oxide (ITO) and indium zinc oxide (IZO) or ytterbium (Yb) alloy and may further include a metal doping layer but is not limited thereto. Even though it is not illustrated in FIGS. 4A to 6, the cathode CA of the light emitting diode OLED is electrically connected to the low potential power line VSS to be supplied with a low potential power voltage.

The bank 115 is disposed between the anode AN and the emission layer EL. The bank 115 is disposed to overlap the active area AA and cover the edge of the anode AN. The bank 115 is disposed at the boundary between the sub pixels SP which are adjacent to each other to reduce the mixture of light emitted from the light emitting diode OLED of each of the plurality of sub pixels SP. The bank 115 may be formed of an insulating material such as, polyimide, acryl, or benzocyclobutene (BCB) resin, but it is not limited thereto.

In the display device 100 according to the exemplary embodiment of the present disclosure, the substrate 110 is formed of any one of a transparent conducting oxide and an oxide semiconductor to reduce a thickness of the display device 100. In the related art, the plastic substrate has been mainly used as the substrate of the display device. However, the plastic substrate is formed by coating and curing a substrate material at a high temperature so that there are problems in that it takes a long time, and it is difficult to form the thickness to be lower than a predetermined level. In contrast, the transparent conducting oxide and the oxide semiconductor may be formed to have a very thin thickness by the deposition process such as sputtering. Therefore, in the display device 100 according to the exemplary embodiment of the present disclosure, a substrate 110 which supports various components of the display device 100 is configured by a transparent conducting oxide layer or the oxide semiconductor layer to reduce a thickness of the display device 100 and implement a slim design.

In the display device 100 according to the exemplary embodiment of the present disclosure, the substrate 110 is formed of a transparent conducting oxide or an oxide semiconductor to improve the flexibility of the display device 100 and reduce the stress generated when the display device 100 is deformed. Specifically, when the substrate 110 is configured by the transparent conducting oxide layer or the oxide semiconductor, the substrate 110 may be formed as a very thin film. In this case, the substrate 110 is also referred to as a first transparent thin film layer. Accordingly, the display device 100 including a substrate 110 may have a high flexibility and the display device 100 may be easily bent or rolled. Therefore, in the display device 100 according to the exemplary embodiment of the present disclosure, the substrate 110 is formed by any one of the transparent conducting oxide layer and the oxide semiconductor to improve the flexibility of the display device 100. Accordingly, the stress generated when the display device 100 is deformed is also relieved so that the crack caused in the display device 100 may be minimized.

In the display device 100 according to the exemplary embodiment of the present disclosure, the substrate 110 is formed of any one of a transparent conducting oxide layer and an oxide semiconductor layer to reduce the possibility of generating the static electricity in the substrate 110. If the substrate 110 is formed of plastic so that the static electricity is generated, various wiring lines and driving elements on the substrate 110 are damaged or the driving is affected due to the static electricity to degrade the display quality. Instead, when the substrate 110 is formed of the transparent conducting oxide layer or the oxide semiconductor layer, the static electricity generated in the substrate 110 is minimized and a configuration for blocking and discharging the static electricity may be simplified. Accordingly, in the display device 100 according to the exemplary embodiment of the present disclosure, the substrate 110 is formed of any one of the transparent conducting oxide layer or the oxide semiconductor having a low possibility of generating the static electricity. By doing this, the damage or the display quality degradation due to the static electricity may be minimized.

In the display device 100 according to the exemplary embodiment of the present disclosure, the substrate 110 is formed of one of the transparent conducting oxide and the oxide semiconductor to minimize the permeation of the moisture or oxygen of the outside into the display device 100 by means of the substrate 110. When the substrate 110 is formed of the transparent conducting oxide layer or the oxide semiconductor, the substrate 110 is formed in the vacuum environment so that the foreign material generation possibility is significantly low. Further, even though the foreign material is generated, the size of the foreign material is very small so that the permeation of the moisture and oxygen into the display device 100 may be minimized. Accordingly, in the display device 100 according to the exemplary embodiment of the present disclosure, the substrate 110 is formed of a transparent conducting oxide or the oxide semiconductor having a low possibility of generating the foreign materials and an excellent moisture permeation performance. By doing this, the reliability of the light emitting diode OLED including an organic layer and the display device 100 may be improved.

In the display device 100 according to the exemplary embodiment of the present disclosure, the substrate 110 is formed of any one of a transparent conducting oxide and an oxide semiconductor to attach a barrier film which is thin and chip below the substrate 110. When the substrate 110 is formed of a material having a low moisture permeation performance, for example, plastic, the moisture permeability may be supplemented by attaching a high performance barrier film. However, in the display device 100 according to the exemplary embodiment of the present disclosure, the substrate 110 is formed of a transparent conducting oxide or an oxide semiconductor having an excellent moisture permeation performance so that a thin and cheap barrier film may be attached below the substrate 110. Accordingly, in the display device 100 according to the exemplary embodiment of the present disclosure, the substrate 110 is configured by any one of the transparent conducting oxide or the oxide semiconductor having an excellent moisture permeation performance to reduce the manufacturing cost of the display device.

In the display device 100 according to the exemplary embodiment of the present disclosure, the substrate 110 is formed of any one of a transparent conducting oxide and an oxide semiconductor to perform a LLO process. When the display device 100 is manufactured, a temporary substrate in which a sacrificial layer is formed is attached below the substrate 110 and then a pixel unit 120 is formed on the substrate 110. The sacrificial layer may use a hydrogenated amorphous silicon or an amorphous silicon which is hydrogenated and doped with impurities. After completing the manufacturing of the display device 100, when a laser is irradiated from the lower portion of the temporary substrate, the hydrogen of the sacrificial layer is dehydrogenated and the sacrificial layer and the temporary substrate may be separated from the substrate 110. At this time, the transparent conducting oxide and the oxide semiconductor are materials which may perform the LLO process with the sacrificial layer and the temporary substrate. Therefore, even though the substrate 110 is formed of any one of the transparent conducting oxide or the oxide semiconductor, the substrate 110 may be easily separated from the temporary substrate. Accordingly, in the display device 100 according to the exemplary embodiment of the present disclosure, the substrate 110 is configured by any one of the transparent conducting oxide layer or the oxide semiconductor which may perform the LLO process. Therefore, the display device 100 may be easily manufactured with the existing process and equipment.

In the meantime, the plurality of substrate patterns 110-1, 110-2, 110-3, 110-4 of the substrate is disposed to be spaced apart from each other and the first inorganic insulating layer 116 is disposed on the plurality of substrate patterns 110-1, 110-2, 110-3, 110-4. In the case of the inorganic insulating layer formed of silicon nitride SiNx, hydrogen is discharged from the silicon nitride SiNx and the active layer of the transistor disposed on the substrate is damaged due to the discharged hydrogen so that there may be a reliability issue in that the threshold voltage of the transistor is changed. Therefore, it is desirable to use silicon oxide SiOx as the first inorganic insulating layer 116. However, the silicon oxide SiOx has a thermal conductivity which is much lower than the transparent conducting oxide and the oxide semiconductor, such as, indium tin oxide (ITO), which configure the plurality of substrate patterns 110-1, 110-2, 110-3, 110-4. Therefore, the plurality of substrate patterns 110-1, 110-2, 110-3, 110-4 which is in contact with the sacrificial layer during the LLO process shows a heat transmission, that is, the heat emission of the sacrificial layer superior to the first inorganic insulating layer 116. Therefore, the sacrificial layer is crystallized to have an asymmetric corn shape so that the plurality of substrate patterns 110-1, 110-2, 110-3, and 110-4 and the temporary substrate are normally separated. However, the first inorganic insulating layer 116 which is in contact with the sacrificial layer shows the heat transmission, that is, the heat emission of the sacrificial layer inferior to the plurality of substrate patterns 110-1, 110-2, 110-3, 110-4 so that the sacrifice layer is crystallized to have a symmetric columnar shape. Therefore, the first inorganic insulating layer 116 and the temporary substrate are not normally separated. That is, a coupled area of the interface between the sacrificial layer and the first inorganic insulating layer 116 may be formed to be larger than a coupled area of the interface between the substrate and the sacrificial layer so that there may be a tearing defect of the first inorganic insulating layer 116 when the temporary substrate is separated.

Therefore, in the display device 100 according to the exemplary embodiment of the present disclosure, the thickness of the plurality of substrate patterns 110-1, 110-2, 110-3, 110-4 of the substrate 110 may be configured to be optimized for the LLO process. By doing this, the tearing defect in accordance with the LLO process may be improved. Specifically, in the display device 100 according to the exemplary embodiment of the present disclosure, the larger the area of the plurality of substrate patterns 110-1, 110-2, 110-3, 110-4, the larger the thickness of the plurality of substrate patterns 110-1, 110-2, 110-3, 110-4. The area of the first emission area EA1 which is the emission area EA of the red sub pixel SPR in which the first substrate pattern 110-1 is disposed and the area of the fourth emission area EA4 which is the emission area EA of the white sub pixel SPW in which the fourth substrate pattern 110-4 is disposed are larger than the area of the second emission area EA2 which is the emission area EA of the green sub pixel SPG in which the second substrate pattern 110-2 is disposed and the area of the third emission area EA3 which is the emission area EA of the blue sub pixel SPB in which the third substrate pattern 110-3 is disposed. Therefore, the thickness of the first substrate pattern 110-1 and the thickness of the fourth substrate pattern 110-4 which are disposed in the first emission area EA1 and the fourth emission area EA4 having a relatively larger area are equal to each other. Further, the thickness of the second substrate pattern 110-2 and the thickness of the third substrate pattern 110-3 which are disposed in the second emission area EA2 and the third emission area EA3 having a relatively smaller area are equal to each other. However, the thickness of the first substrate pattern 110-1 and the thickness of the fourth substrate pattern 110-4 may be larger than the thickness of the second substrate pattern 110-2 and the thickness of the third substrate pattern 110-3. Therefore, in the first emission area EA1 and the fourth emission area EA4 having a large contact area with the sacrificial layer, a ratio of the substrate pattern having a higher thermal conductivity than that of the first inorganic insulating layer 116 may be increased. Accordingly, the thermal conductivity of the first emission area EA1 and the fourth emission area EA4 having a large contact area with the sacrificial layer may be improved. Therefore, in the display device 100 according to the exemplary embodiment of the present disclosure, the thickness of the plurality of substrate patterns 110-1, 110-2, 110-3, 110-4 may be configured to be optimized for the LLO process. By doing this, the tearing defect in accordance with the LLO process may be improved and the damage caused by the LLO process may be minimized.

Further, in the display device 100 according to the exemplary embodiment of the present disclosure, as described above, the thickness of the plurality of substrate patterns 110-1, 110-2, 110-3, 110-4 is configured to be optimized for the LLO process so that a number of masks for forming the plurality of substrate patterns 110-1, 110-2, 110-3, 110-4 may be minimized. That is, the thickness of the first substrate pattern 110-1 and the thickness of the fourth substrate pattern 110-4 which are disposed in the first emission area EA1 and the fourth emission area EA4 having a relatively larger area are equal to each other. Further, the thickness of the second substrate pattern 110-2 and the thickness of the third substrate pattern 110-3 which are disposed in the second emission area EA2 and the third emission area EA3 having a relatively smaller area are equal to each other. Therefore, in the display device 100 according to the exemplary embodiment of the present disclosure, as compared with a case that the plurality of substrate patterns 110-1, 110-2, 110-3, 110-4 is formed to have different thicknesses, the number of masks for forming the plurality of substrate patterns 110-1, 110-2, 110-3, 110-4 is reduced. Further, the thickness of the plurality of substrate patterns 110-1, 110-2, 110-3, 110-4 optimized for the LLO process may be ensured.

In the meantime, no color filter CF is not disposed in the white sub pixel SPW so that the emission layer EL of the light emitting diode OLED disposed in the white sub pixel SPW may be damaged by the laser used during the LLO processor.

Therefore, in the display device 100 according to the exemplary embodiment of the present disclosure, the thickness of the fourth substrate pattern 110-4 disposed in the fourth emission area EA4 which is an emission area EA of the white sub pixel SPW is formed to be large. Accordingly, the damage of the emission layer EL caused due to the LLO process may be reduced. That is, in the display device 100 according to the exemplary embodiment of the present disclosure, the fourth substrate pattern 110-4 which is thicker than the other emission area EA in which the color filter CF is disposed is disposed in the white sub pixel SPW. Accordingly, laser used during the LLO process which reaches the emission layer EL of the white sub pixel SPW is reduced by the fourth substrate pattern 110-4 and thus the damage of the emission layer EL may be reduced.

In the meantime, when the plurality of substrate patterns 110-1, 110-2, 110-3, 110-4 is formed of a transparent conducting oxide or an oxide semiconductor, a parasitic capacitance may be generated between the plurality of substrate patterns 110-1, 110-2, 110-3, 110-4 and the plurality of transistors TR1, TR2, TR3, the storage capacitor SC, and the plurality of signal lines. First, when the parasitic capacitance is generated in the plurality of transistors TR1, TR2, TR3 and the storage capacitor SC, a driving failure may be generated. Further, when the parasitic capacitance is generated in the gate line GL, the sensing line SL, the data line DL, and the reference line RL which transmit an AC voltage, a noise may be caused in the signal line. When the parasitic capacitance is generated in the signal line as described above, RC delay may be generated.

Accordingly, in the display device 100 according to the exemplary embodiment of the present disclosure, the plurality of substrate patterns 110-1, 110-2, 110-3, 110-4 is disposed so as to correspond to the emission area EA. Therefore, the substrate patterns 110-1, 110-2, 110-3, 110-4 and the plurality of transistors TR1, TR2, TR3 and the storage capacitor SC may not overlap and the overlapping of the substrate patterns 110-1, 110-2, 110-3, 110-4 and the plurality of signal lines may be reduced. Accordingly, in the display device 100 according to the exemplary embodiment of the present disclosure, the plurality of substrate patterns 110-1, 110-2, 110-3, 110-4 is disposed so as to correspond to the emission area EA. Therefore, the generation of the parasitic capacitance between the plurality of substrate patterns 110-1, 110-2, 110-3, 110-4 and the plurality of transistors TR1, TR2, TR3 and the storage capacitor SC may be suppressed. Further, in the display device 100 according to the exemplary embodiment of the present disclosure, the plurality of substrate patterns 110-1, 110-2, 110-3, 110-4 is disposed so as to correspond to the emission area EA has a rectangular shape. Therefore, the parasitic capacitance between the plurality of substrate patterns 110-1, 110-2, 110-3, 110-4 and the plurality of signal lines may be reduced.

Figure 7:
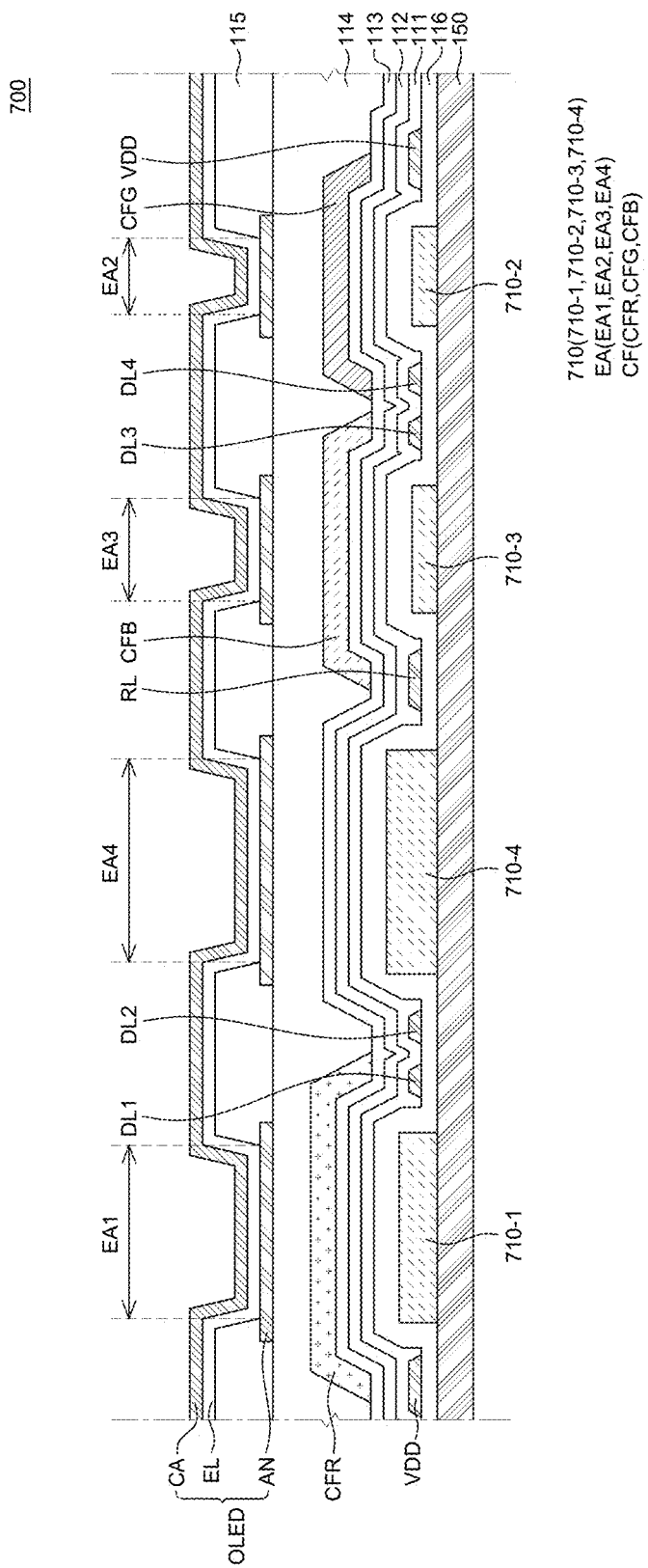
FIG. 7 is a cross-sectional view of a display device according to another exemplary embodiment of the present disclosure.

FIG. 7 is a cross-sectional view of a display device according to another exemplary embodiment of the present disclosure. The only difference between a display device 700 of FIG. 7 and the display device 100 of FIGS. 1 to 6 is a thickness of a substrate 710, but the other configuration is substantially the same, so that a redundant description will be omitted.

Referring to FIG. 7, the substrate 710 includes a plurality of substrate patterns 710-1, 710-2, 710-3, and 710-4. The plurality of substrate patterns 710-1, 710-2, 710-3, and 710-4 includes a first substrate pattern 710-1, a second substrate pattern 710-2, a third substrate pattern 710-3 and a fourth substrate pattern 710-4. The first substrate pattern 710-1 corresponds to the red sub pixel SPR, the second substrate pattern 710-2 corresponds to the green sub pixel SPG, the third substrate pattern 710-3 corresponds to the blue sub pixel SPB, and the fourth substrate pattern 710-4 corresponds to the white sub pixel SPW.

Therefore, the plurality of substrate patterns 710-1, 710-2, 710-3, and 710-4 is disposed so as to correspond to the emission areas EA of the plurality of sub pixels SP. Therefore, the plurality of substrate patterns 710-1, 710-2, 710-3, and 710-4 is disposed so as to overlap the emission areas EA of the plurality of sub pixels SP. At this time, the plurality of substrate patterns 710-1, 710-2, 710-3, and 710-4 has a rectangle shape corresponding to the emission area EA of each of the plurality of sub pixels SP. Therefore, the plurality of substrate patterns 710-1, 710-2, 710-3, and 710-4 may be larger than areas of the emission areas EA of the plurality of sub pixels SP.

Referring to FIG. 7, the first substrate pattern 710-1, the second substrate pattern 710-2, the third substrate pattern 710-3 and the fourth substrate pattern 710-4 of the plurality of substrate patterns 710-1, 710-2, 710-3, and 710-4 have different thicknesses. The plurality of substrate patterns 710-1, 710-2, 710-3, and 710-4 may be configured to have thicknesses proportional to the areas of the emission areas EA in which the plurality of substrate patterns 710-1, 710-2, 710-3, and 710-4 is disposed. That is, the larger the area of the plurality of substrate patterns 710-1, 710-2, 710-3, and 710-4, the larger the thickness of the plurality of substrate patterns 710-1, 710-2, 710-3, and 710-4. Specifically, the area of the fourth emission area EA4 which is an emission area EA of the white sub pixel SPW which is the fourth sub pixel is larger than the area of the first emission area EA1 which is an emission area EA of the red sub pixel SPR which is the first sub pixel. The area of the first emission area EA1 which is an emission area EA of the red sub pixel SPR which is the first sub pixel is larger than the area of the third emission area EA3 which is an emission area of the blue sub pixel SPB which is the third sub pixel. The area of the third emission area EA3 which is an emission area of the blue sub pixel SPB which is the third sub pixel is larger than the area of the second emission area EA2 which is an emission area EA of the green sub pixel SPG which is the second sub pixel. Therefore, the areas of the emission areas EA in the plurality of sub pixels SP are reduced in the order of the fourth emission area EA4, the first emission area EA1, the third emission area EA3, and the second emission area EA. Further, the areas of the plurality of substrate patterns 710-1, 710-2, 710-3, and 710-4 are also reduced in the order of the fourth substrate pattern 710-4, the first substrate pattern 710-1, the third substrate pattern 710-3, and the second substrate pattern 710-2. Therefore, the thicknesses of the plurality of substrate patterns 710-1, 710-2, 710-3, and 710-4 are reduced in the order of the fourth substrate pattern 710-4, the first substrate pattern 710-1, the third substrate pattern 710-3, and the second substrate pattern 710-2.

Therefore, in the display device 700 according to another exemplary embodiment of the present disclosure, the thickness of the plurality of substrate patterns 710-1, 710-2, 710-3, 710-4 of the substrate 710 may be configured to be optimized for the LLO process. By doing this, the tearing defect in accordance with the LLO process may be improved. Specifically, in the display device 700 according to another exemplary embodiment of the present disclosure, the larger the area of the plurality of substrate patterns 710-1, 710-2, 710-3, 710-4, the larger the thickness of the plurality of substrate patterns 710-1, 710-2, 710-3, 710-4. That is, the areas of the emission areas EA in the plurality of sub pixels SP are reduced in the order of the fourth emission area EA4, the first emission area EA1, the third emission area EA3, and the second emission area EA. Further, the areas of the plurality of substrate patterns 710-1, 710-2, 710-3, and 710-4 are also reduced in the order of the fourth substrate pattern 710-4, the first substrate pattern 710-1, the third substrate pattern 710-3, and the second substrate pattern 710-2. Therefore, the thicknesses of the plurality of substrate patterns 710-1, 710-2, 710-3, and 710-4 are reduced in the order of the fourth substrate pattern 710-4, the first substrate pattern 710-1, the third substrate pattern 710-3, and the second substrate pattern 710-2. Accordingly, the thermal conductivity may be improved in the order of a larger contact area with the sacrificial layer. Therefore, in the display device 700 according to another exemplary embodiment of the present disclosure, the thickness of the plurality of substrate patterns 710-1, 710-2, 710-3, 710-4 may be configured to be optimized for the LLO process. By doing this, the tearing defect in accordance with the LLO process may be improved and the damage caused by the LLO process may be minimized.

That is, in the display device 700 according to another exemplary embodiment of the present disclosure, the fourth substrate pattern 710-4 having the largest thickness than the other emission area EA in which the color filter CF is disposed is disposed in the white sub pixel SPW. Accordingly, laser used during the LLO process which reaches the emission layer EL of the white sub pixel SPW is reduced by the fourth substrate pattern 710-4 and thus the damage of the emission layer EL may be reduced.

Figure 8A:
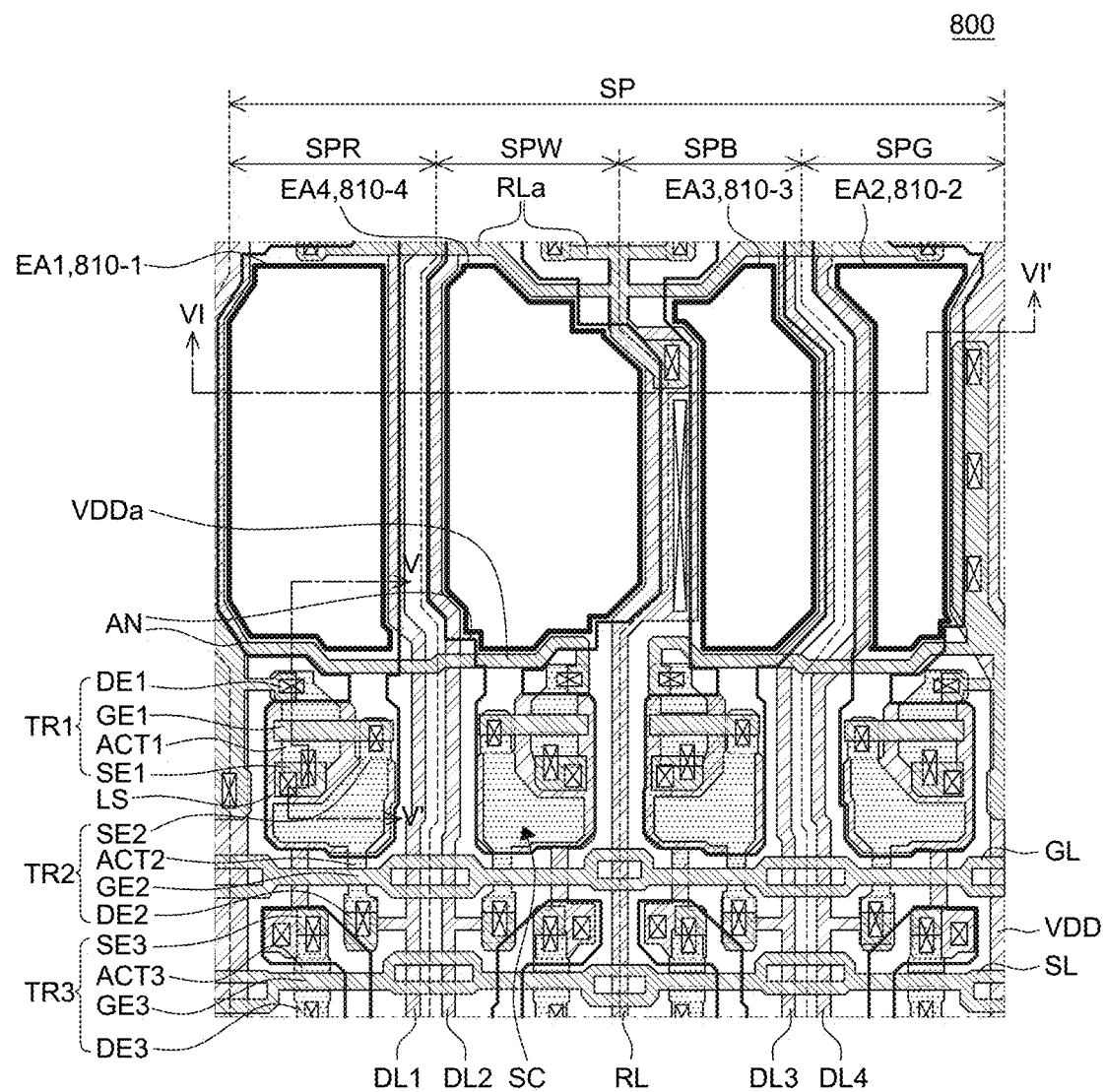
FIG. 8A is a plan view of a display device according to still another exemplary embodiment of the present disclosure.
Figure 8B:
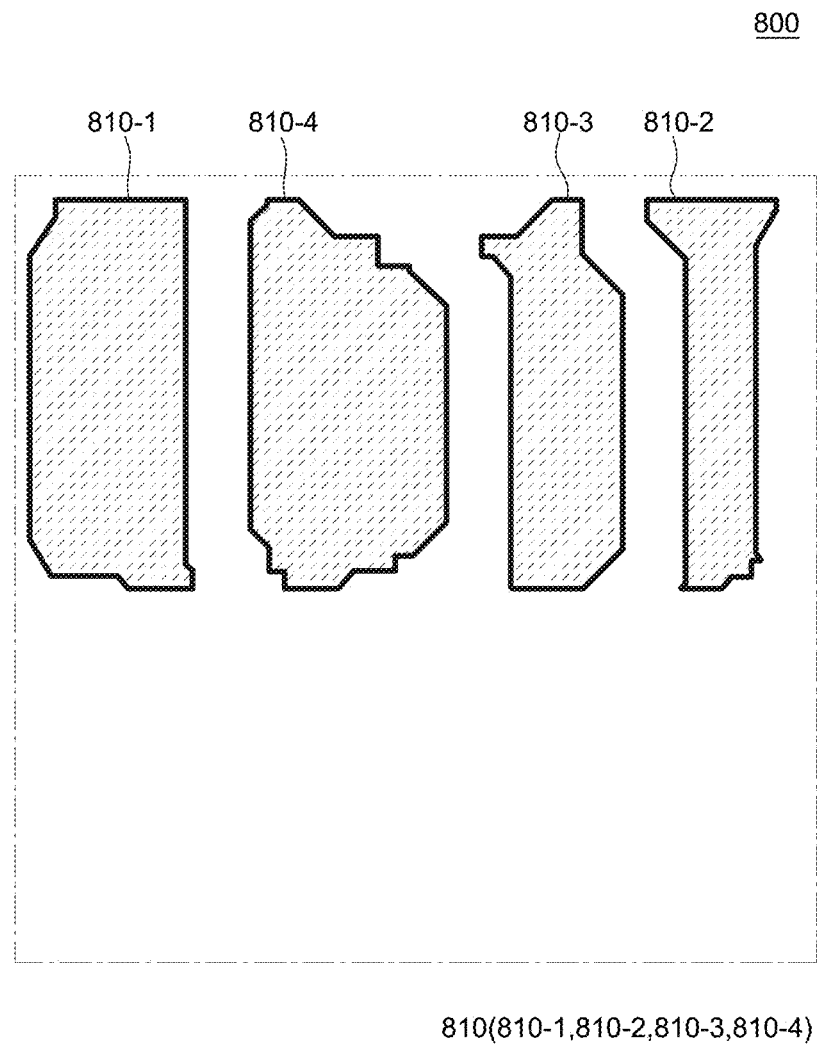
FIG. 8B is a view for explaining a substrate of a display device according to still another exemplary embodiment of the present disclosure.

FIG. 8A is a plan view of a display device according to still another exemplary embodiment of the present disclosure and FIG. 8B is a view for explaining a substrate of a display device according to an exemplary embodiment of the present disclosure. The only difference between a display device 800 of FIGS. 8A and 8B and the display device 700 of FIG. 7 is a planar shape of a substrate 810, but the other configuration is substantially the same, so that a redundant description will be omitted. In FIG. 8A, for the convenience of description, the color filter CF and the bank 115 are not illustrated and an edge of the substrate 810 is illustrated with a bold solid line. In FIG. 8B, for the convenience of description, among components of the display device 800, only a substrate 810 is illustrated.

Referring to FIGS. 8A and 8B, the substrate 810 includes a plurality of substrate patterns 810-1, 810-2, 810-3, and 810-4. The plurality of substrate patterns 810-1, 810-2, 810-3, and 810-4 includes a first substrate pattern 810-1, a second substrate pattern 810-2, a third substrate pattern 810-3 and a fourth substrate pattern 810-4. The first substrate pattern 810-1 corresponds to a red sub pixel, the second substrate pattern 810-2 corresponds to a green sub pixel SPG, the third substrate pattern 810-3 corresponds to a blue sub pixel SPB, and the fourth substrate pattern 810-4 corresponds to a white sub pixel SPW.

Therefore, the plurality of substrate patterns 810-1, 810-2, 810-3, and 810-4 is disposed so as to correspond to the emission areas EA of the plurality of sub pixels SP. Therefore, the plurality of substrate patterns 810-1, 810-2, 810-3, and 810-4 is disposed so as to overlap the emission areas EA of the plurality of sub pixels SP. At this time, the plurality of substrate patterns 810-1, 810-2, 810-3, and 810-4 has a shape which completely corresponds to the emission area EA of each of the plurality of sub pixels SP. That is, the first substrate pattern 810-1 may overlap the first emission area EA1 with a shape completely corresponding to the first emission area EA1 and the second substrate pattern 810-2 may overlap the second emission area EA2 with a shape completely corresponding to the second emission area EA2. The third substrate pattern 810-3 may overlap the third emission area EA3 with a shape completely corresponding to the third emission area EA3 and the fourth substrate pattern 810-4 may overlap the fourth emission area EA4 with a shape completely corresponding to the fourth emission area EA4. Therefore, the plurality of substrate patterns 810-1, 810-2, 810-3, and 810-4 may have the same area as the emission areas EA of the plurality of sub pixels SP.

In the display device 800 according to still another exemplary embodiment of the present disclosure, each of the plurality of substrate patterns 810-1, 810-2, 810-3, 810-4 is disposed so as not to overlap a conductive component other than the light emitting diode OLED. By doing this, the parasitic capacitance caused by the plurality of substrate patterns 810-1, 810-2, 810-3, 810-4 may be minimized. That is, in the display device 800 according to the exemplary embodiment of the present disclosure, the plurality of substrate patterns 810-1, 810-2, 810-3, 810-4 is disposed so as to correspond to the emission area EA. Therefore, the generation of the parasitic capacitance between the plurality of substrate patterns 810-1, 810-2, 810-3, 810-4 and the plurality of transistors TR1, TR2, TR3 and the storage capacitor SC may be suppressed. Further, in the display device 800 according to the exemplary embodiment of the present disclosure, the plurality of substrate patterns 810-1, 810-2, 810-3, 810-4 is disposed so as to correspond to the emission area EA and the plurality of substrate patterns 810-1, 810-2, 810-3, 810-4 has a shape corresponding to the emission area EA. Therefore, the generation of the parasitic capacitance between the plurality of substrate patterns 810-1, 810-2, 810-3, 810-4 and the plurality of signal lines may be suppressed.

Figure 9:
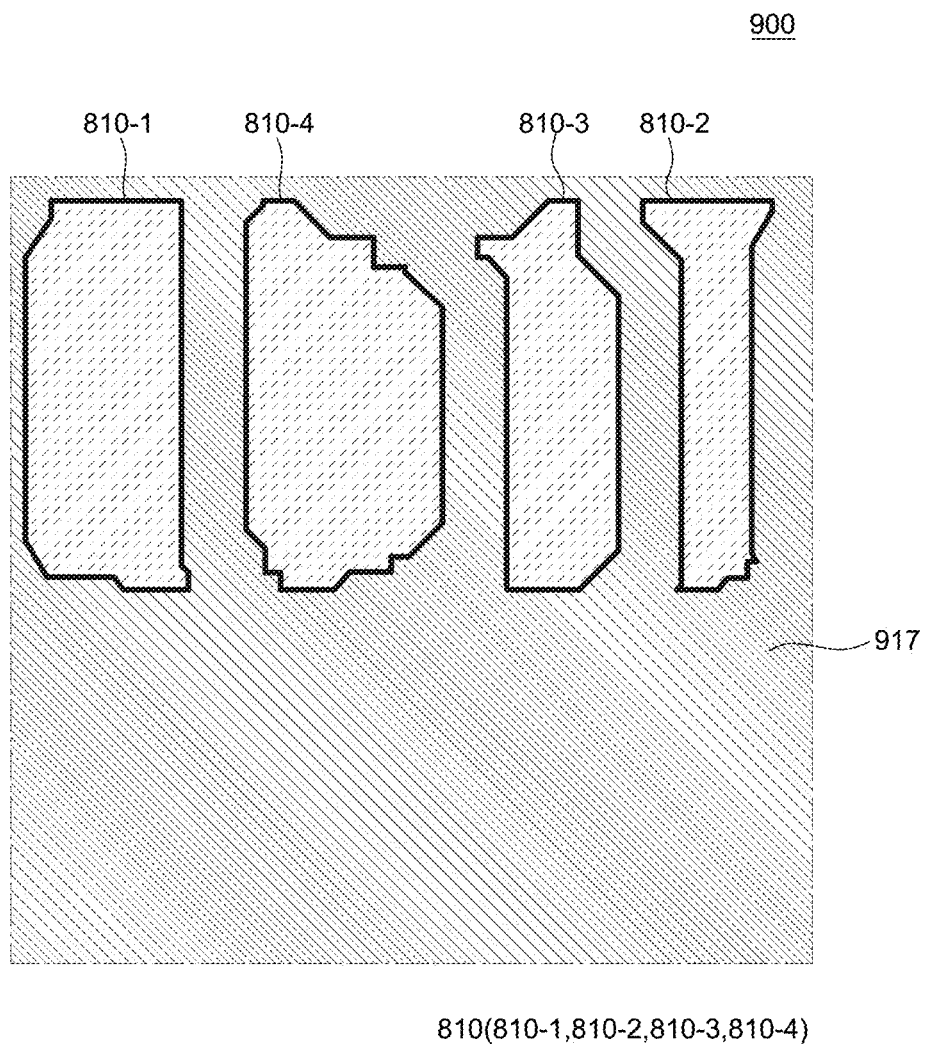
FIG. 9 is a view for explaining a substrate of a display device according to still another exemplary embodiment of the present disclosure.
Figure 10:
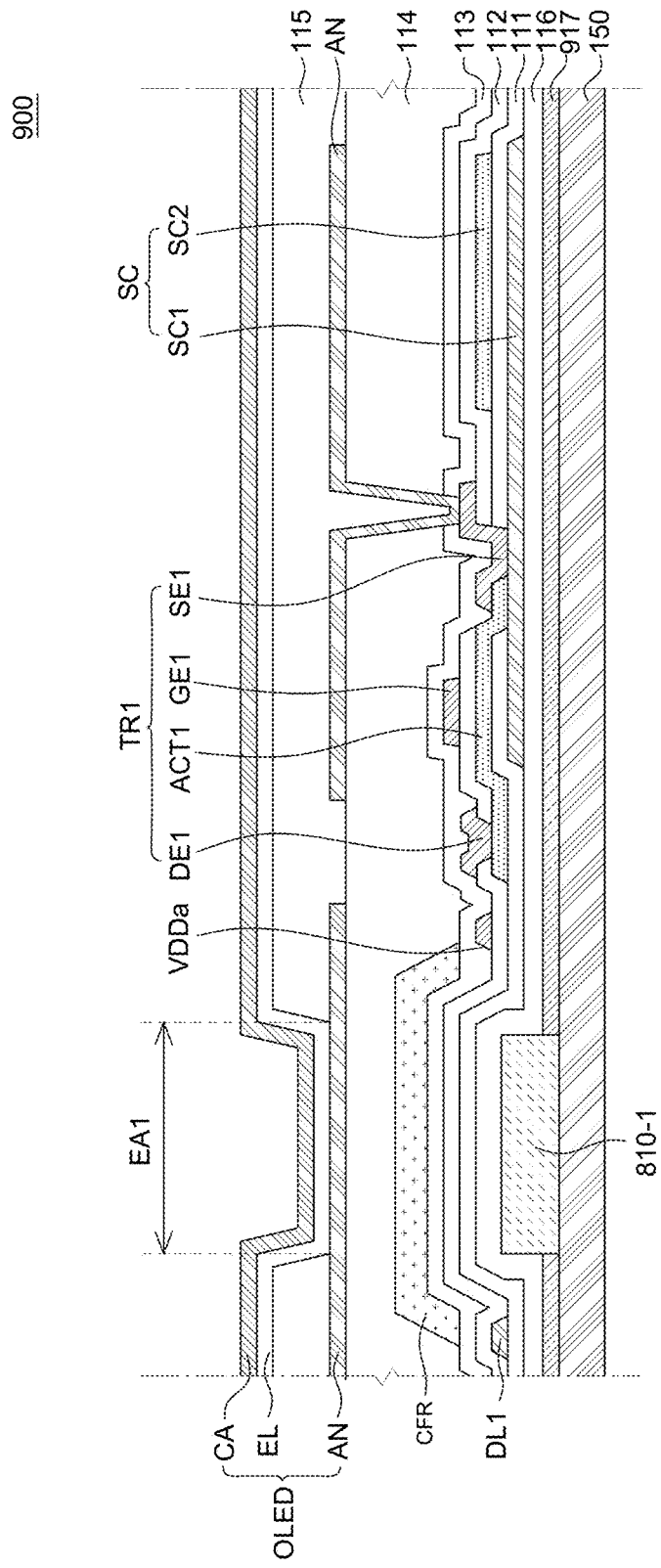
FIGS. 10 and 11 are cross-sectional views of a display device according to still another exemplary embodiment of the present disclosure.
Figure 11:
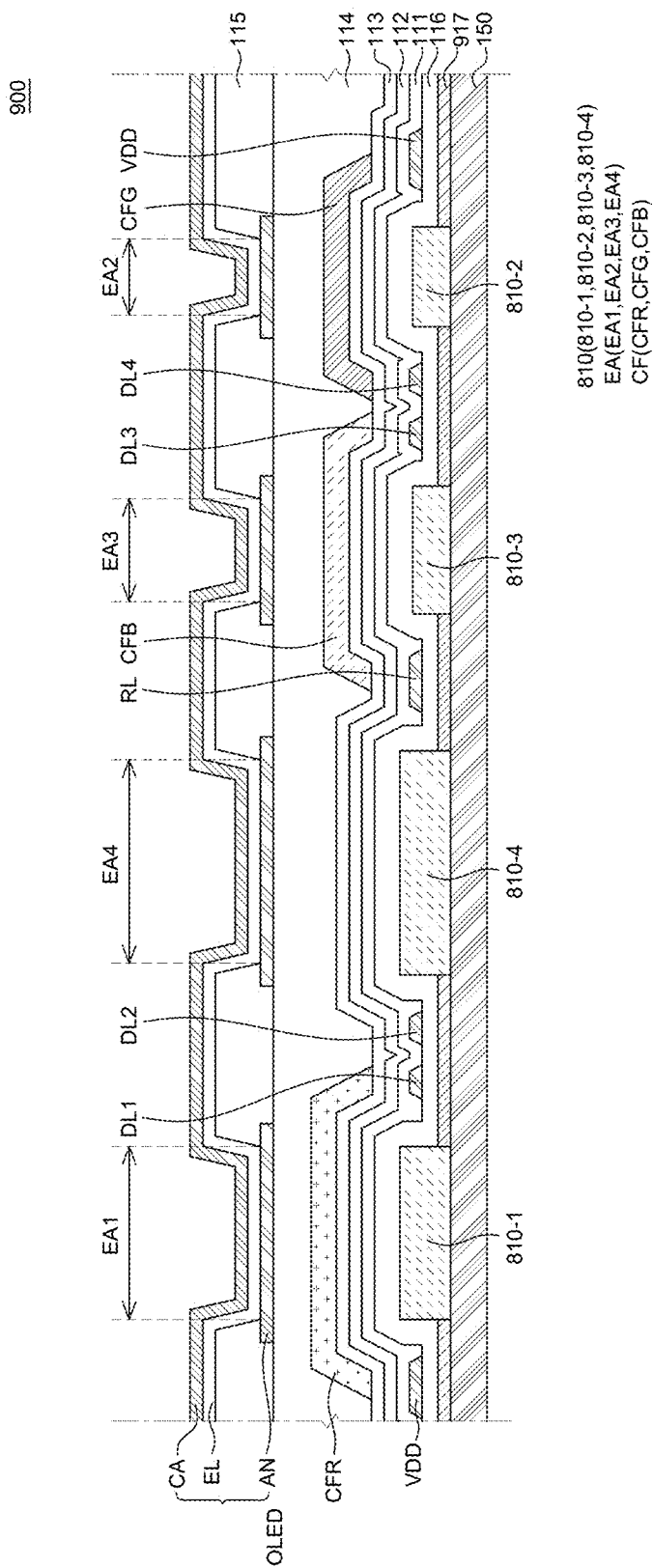

FIG. 9 is a view for explaining a substrate of a display device according to still another exemplary embodiment of the present disclosure. FIGS. 10 and 11 are cross-sectional views of a display device according to still another exemplary embodiment of the present disclosure. A display device 900 of FIGS. 9 to 11 further includes a second inorganic light emitting layer 917 as compared with the display device 800 of FIGS. 8A and 8B, but the other configuration is substantially the same so that a redundant description will be omitted.

Referring to FIGS. 9 to 11, the second inorganic insulating layer 917 is disposed on the same plane as the plurality of substrate patterns 810-1, 810-2, 810-3, 810-4. The second inorganic insulating layer 917 is disposed in an area excluding an area where the plurality of substrate patterns 810-1, 810-2, 810-3, 810-4 is disposed. Therefore, the plurality of substrate patterns 810-1, 810-2, 810-3, 810-4 and the second inorganic insulating layer 917 are disposed on the same plane on the polarizer 150. Further, the first inorganic insulating layer 116 is disposed so as to be in contact with the plurality of substrate patterns 810-1, 810-2, 810-3, 810-4 and the second inorganic insulating layer 917 on the plurality of substrate patterns 810-1, 810-2, 810-3, 810-4 and the second inorganic insulating layer 917.

The second inorganic insulating layer 917 may be formed of a material having a thermal conductivity higher than that of the plurality of substrate patterns 810-1, 810-2, 810-3, 810-4. For example, the second inorganic insulating layer 917 is formed of silicon nitride SiNx and is configured by a signal layer or a double layer, but is not limited thereto. Therefore, a thermal conductivity of the second inorganic insulating layer 917 is higher than a thermal conductivity of the plurality of substrate patterns 810-1, 810-2, 810-3, 810-4 and the thermal conductivity of the plurality of substrate patterns 810-1, 810-2, 810-3, 810-4 is higher than the first inorganic insulating layer 116.

Referring to FIGS. 10 and 11, the thickness of the plurality of substrate patterns 810-1, 810-2, 810-3, 810-4 may be larger than the thickness of the second inorganic insulating layer 917. The thickness of the second inorganic insulating layer 917 is smaller than a thickness of the second substrate pattern 810-2 having the smallest thickness, among the plurality of substrate patterns 810-1, 810-2, 810-3, 810-4. When the thickness of the second inorganic insulating layer 917 is larger than the thickness of the plurality of substrate patterns 810-1, 810-2, 810-3, 810-4, the thermal conductivity of the second inorganic insulating layer 917 is higher than the thermal conductivity of the plurality of substrate patterns 810-1, 810-2, 810-3, 810-4. Therefore, in an area where the second inorganic insulating layer 917 is disposed, the separation from the temporary substrate is smoothly performed during the LLO process, but in an area where the plurality of substrate patterns 810-1, 810-2, 810-3, 810-4 is disposed, the separation from the temporary substrate may not be smoothly performed. Further, since the second inorganic insulating layer 917 is formed of silicon nitride SiNx, hydrogen may be generated from the second inorganic insulating layer 917 and the performance of the transistors TR1, TR2, TR3 may be deteriorated due to the generated hydrogen. Accordingly, the thickness of the plurality of substrate patterns 810-1, 810-2, 810-3, 810-4 may be larger than the thickness of the second inorganic insulating layer 917.

In the display device 900 according to still another exemplary embodiment of the present disclosure, the second inorganic insulating layer 917 having a higher thermal conductivity than those of the plurality of substrate patterns 810-1, 810-2, 810-3, 810-4 and the first inorganic insulating layer 116 is disposed in an area in which the plurality of substrate patterns 810-1, 810-2, 810-3, 810-4 is not disposed. Therefore, the tearing defect which may be caused during the LLO process may be improved. When silicon oxide SiOx is used for the first inorganic insulating layer 116 as described above, a thermal conductivity of silicon oxide SiOx is significantly low so that the first inorganic insulating layer 116 and the temporary substrate may not be normally separated during the LLO process. Further, the tearing defect of the first inorganic insulating layer 116 may be caused. Therefore, in the display device 900 according to still another exemplary embodiment of the present disclosure, the second inorganic insulating layer 917 having a higher thermal conductivity than that of the plurality of substrate patterns 810-1, 810-2, 810-3, 810-4 is disposed in an area in which the plurality of substrate patterns 810-1, 810-2, 810-3, 810-4 is not disposed. Therefore, the LLO process may be performed in both the area in which the plurality of substrate patterns 810-1, 810-2, 810-3, 810-4 is disposed and the area in which the second inorganic insulating layer 917 is disposed without causing any problem. Therefore, the tearing defect of the first inorganic insulating layer 116 which may be generated during the LLO process may be suppressed.

Further, in the display device 900 according to still another exemplary embodiment of the present disclosure, the thickness of the second inorganic insulating layer 917 is formed to be smaller than that of each of the plurality of substrate patterns 810-1, 810-2, 810-3, 810-4. Accordingly, not only the tearing defect generated during the LLO process is improved, but also the performance deterioration of the transistors TR1, TR2, TR3 by the second inorganic insulating layer 917 may be minimized. That is, in order to minimize hydrogen which may be generated from the second inorganic insulating layer 917 which is formed of silicon nitride SiNx, the second inorganic insulating layer 917 is formed to have a small thickness. Therefore, the problem such as a threshold voltage fluctuation of the transistors TR1, TR2, TR3 which may be generated by adding the second inorganic insulating layer 917 is minimized to suppress the lowering of the reliability of the transistors TR1, TR2, TR3.

Figure 12:
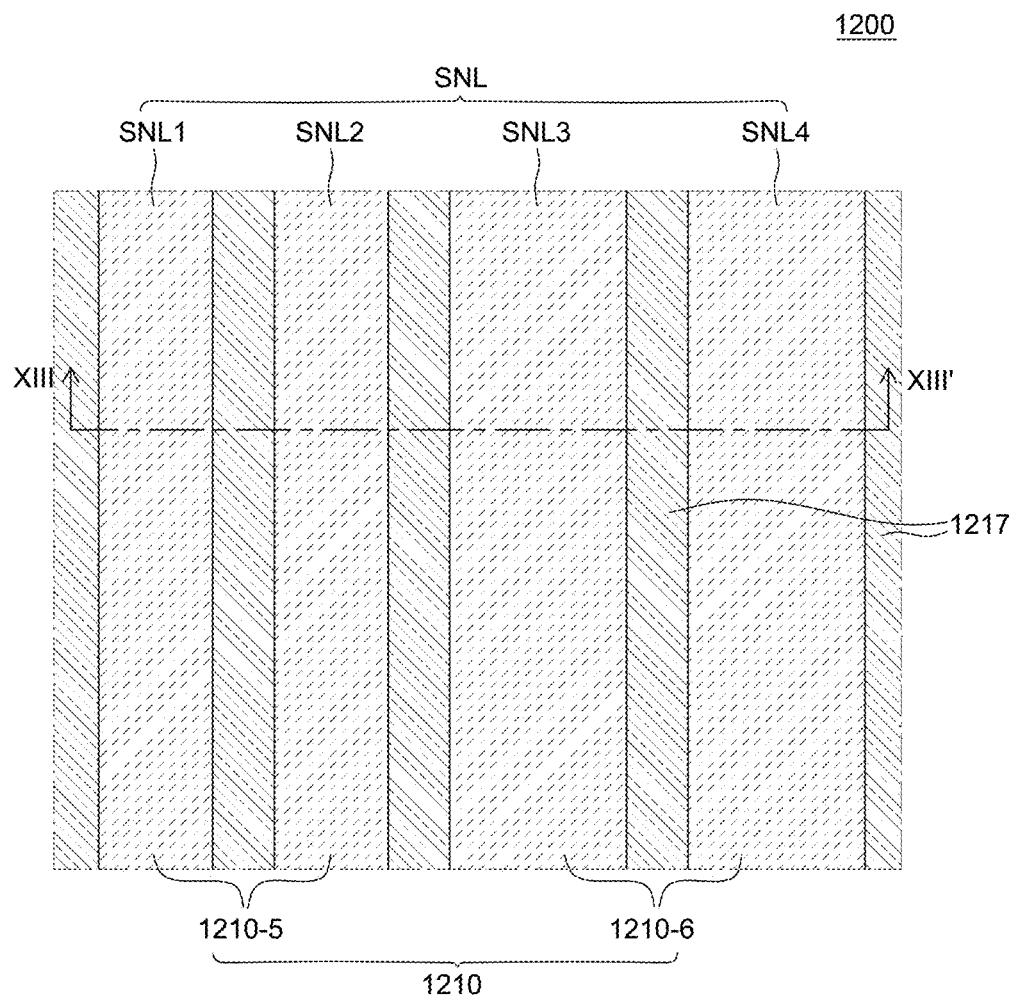
FIG. 12 is a schematic plan view of a display device according to still another exemplary embodiment of the present disclosure.
Figure 13:
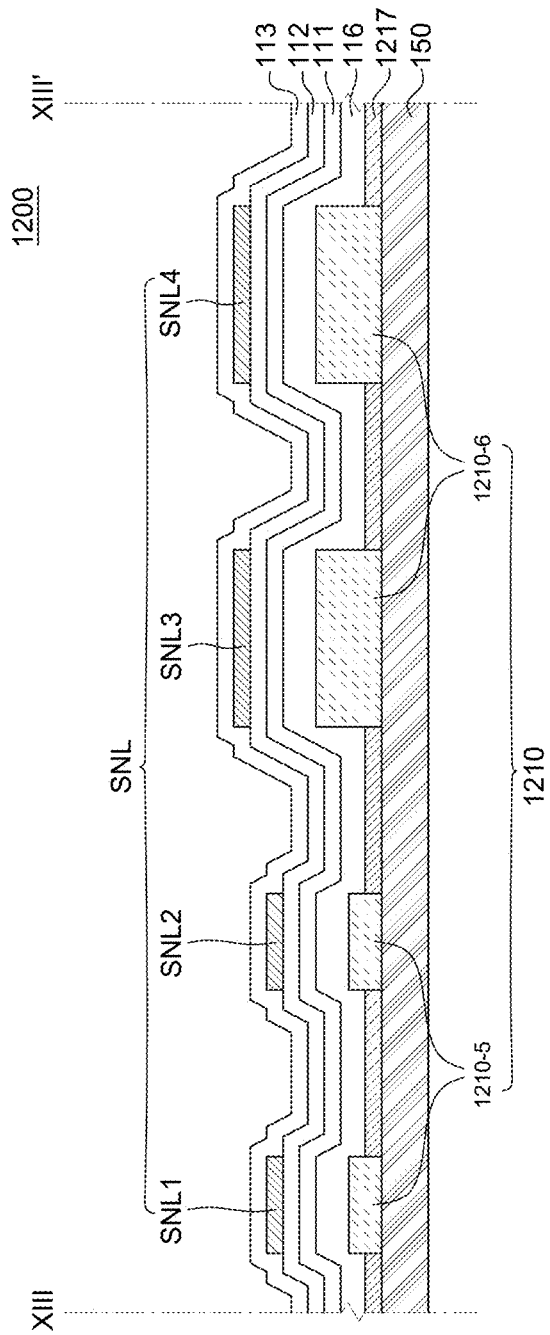
FIG. 13 is a cross-sectional view taken along the line XIII-XIII' of FIG. 12.

FIG. 12 is a schematic plan view of a display device according to still another exemplary embodiment of the present disclosure. FIG. 13 is a cross-sectional view taken along the line XIII-XIII' of FIG. 12. The only difference of a display device 1200 of FIGS. 12 and 13 and the display device 900 of FIGS. 9 to 11 is that a substrate 1210 further includes a fifth substrate pattern 1210-5 and a sixth substrate pattern 1210-6, but the other configuration is substantially the same so that a redundant description will be omitted. FIG. 12 is a schematic plan view of an area of the non-active area NA of the display device 1200 in which a plurality of signal lines SNL is disposed. In FIG. 12, for the convenience of description, among components of the display device 1200, only the plurality of signal lines SNL and a second inorganic insulating layer 1217 are illustrated. In FIG. 13, for the convenience of description, among components of the display device 1200, only from the polarizer 150 to the passivation layer 113 are illustrated.

Referring to FIGS. 12 and 13, the plurality of signal lines SNL is disposed in the non-active area NA on the substrate 1210. The plurality of signal lines SNL is various signal lines which are disposed in the non-active area NA and includes various routing lines, clock lines, high potential power link lines, and low potential power link lines. Even though in FIG. 13, it is illustrated that the plurality of signal lines SNL is disposed on the gate insulating line 112, it is not limited thereto.

The plurality of signal lines SNL may include a first signal line SNL1 and a second signal line SNL2. The first signal line SNL1 and the second signal line SNL2 may transmit the same signal or different signals. However, a width of the first signal line SNL1 may be larger than a width of the second signal line SNL2.

The plurality of substrate patterns 810-1, 810-2, 810-3, 810-4 may further include a plurality of additional substrate patterns 1210 which overlaps the plurality of signal lines SNL. That is, the plurality of substrate patterns 810-1, 810-2, 810-3, 810-4 may further include a fifth substrate pattern 1210-5 and a sixth substrate pattern 1210-6 in addition to the first substrate pattern 810-1, the second substrate pattern 810-2, the third substrate pattern 810-3, and the fourth substrate pattern 810-4 disposed in the active area AA. The fifth substrate pattern 1210-5 is a substrate pattern overlapping the first signal line SNL1 and the sixth substrate pattern 1210-6 is a substrate pattern overlapping the second signal line SNL2.

The fifth substrate pattern 1210-5 and the sixth substrate pattern 1210-6 which are the plurality of additional substrate patterns 1210 may be linearly disposed along the plurality of signal lines SNL. The fifth substrate pattern 1210-5 may be disposed with a line shape overlapping the first signal line SNL1 and the sixth substrate pattern 1210-6 may be disposed with a line shape overlapping the second signal line SNL2.

At this time, the larger the widths of the signal lines SNL disposed on the fifth substrate pattern 1210-5 and the sixth substrate pattern 1210-6 which are the plurality of additional substrate patterns 1210, the larger the thicknesses of the fifth substrate pattern 1210-5 and the sixth substrate pattern 1210-6 which are the plurality of additional substrate patterns 1210. As described above, since the width of the second signal line SNL2 is larger than the width of the first signal line SNL1, the thickness of the sixth substrate pattern 1210-6 may be larger than the thickness of the fifth substrate pattern 1210-5.

In the display device 1200 according to still another exemplary embodiment of the present disclosure, the thickness of the plurality of additional substrate patterns 1210-5 and 1210-6 of the substrate 1210 may be configured to be optimized for the LLO process. By doing this, the tearing defect in accordance with the LLO process may be improved. Specifically, in the display device 1200 according to still another exemplary embodiment of the present disclosure, as the areas of the plurality of additional substrate patterns 1210-5 and 1210-6 are increased, the thicknesses of the plurality of additional substrate patterns 1210-5 and 1210-6 are configured to be increased. A width of the first signal line SNL1 overlapping the fifth substrate pattern 1210-5 is smaller than a width of the second signal line SNL2 overlapping the sixth substrate pattern 1210-6. Therefore, the thickness of the sixth substrate pattern 1210-6 having a relatively larger area may be larger than the thickness of the fifth substrate pattern 1210-5 having a relatively smaller area. Therefore, a ratio of the sixth substrate pattern 1210-6 having a large contact area with the sacrificial layer may be increased so that the thermal conductivity of the sixth substrate pattern 1210-6 having a large contact area with the sacrificial layer may be improved. Accordingly, in the display device 1200 according to still another exemplary embodiment of the present disclosure, the thickness of the plurality of additional substrate patterns 1210-5 and 1210-6 may be configured to be optimized for the LLO process. By doing this, the tearing defect in accordance with the LLO process may be improved and the damage caused by the LLO process may be minimized.

Further, in the display device 1200 according to still another exemplary embodiment of the present disclosure, the fifth substrate pattern 1210-5 and the sixth substrate pattern 1210-6 which are the plurality of additional substrate patterns 1210 may be linearly disposed along the plurality of signal lines SNL. That is, each fifth substrate pattern 1210-5 may overlap one first signal line SNL1 and each sixth substrate pattern 1210-6 overlaps one second signal line SNL2. Therefore, one signal line SNL overlaps only one additional substrate pattern 1210-5 or 1210-6 so that the parasitic capacitance between the signal line SNL and the additional substrate patterns 1210-5 and 1210-6 may be minimized.

Figure 14:
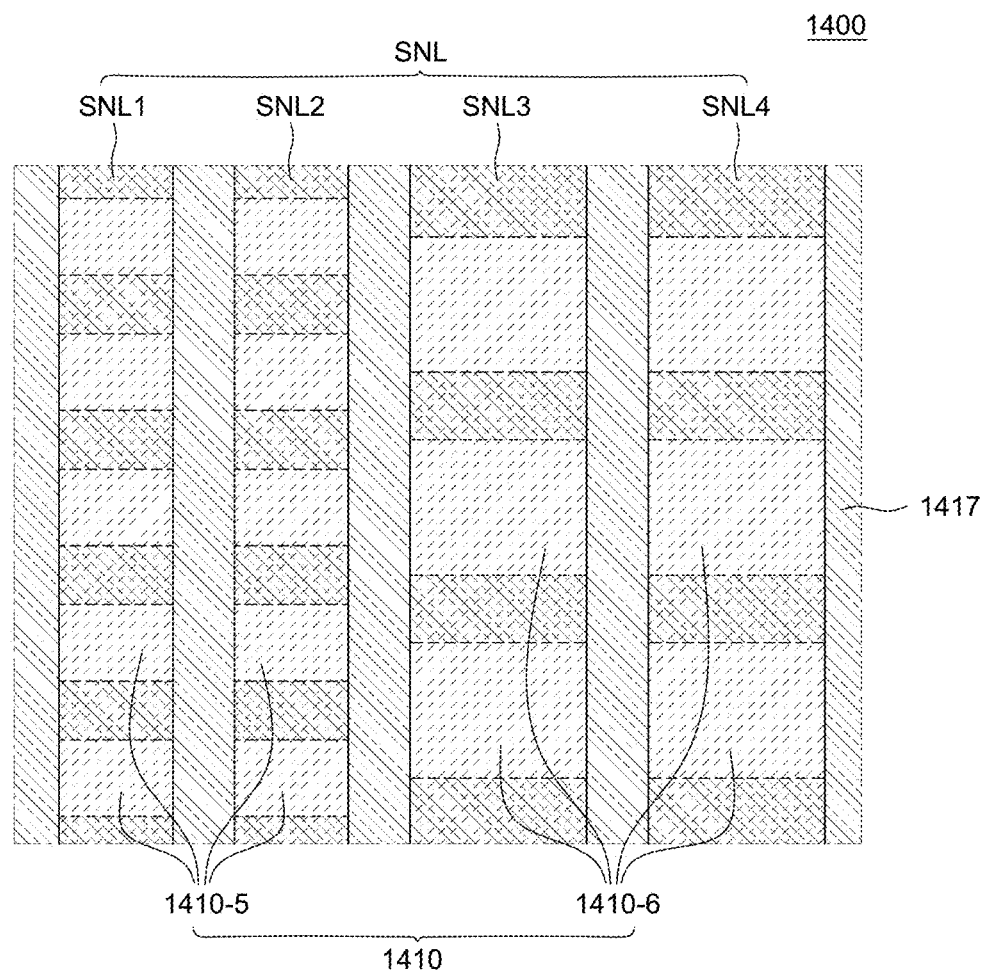
FIG. 14 is a schematic plan view of a display device according to still another exemplary embodiment of the present disclosure.

FIG. 14 is a schematic plan view of a display device according to still another exemplary embodiment of the present disclosure. The only difference of a display device 1400 of FIG. 14 and the display device 1200 of FIGS. 12 and 13 is a fifth substrate pattern 1410-5 and a sixth substrate pattern 1410-6, but the other configuration is substantially the same so that a redundant description will be omitted.

The plurality of substrate patterns 810-1, 810-2, 810-3, 810-4 may further include a plurality of additional substrate patterns 1410-5 and 1410-6 which overlaps the plurality of signal lines SNL. That is, the plurality of substrate patterns 810-1, 810-2, 810-3, 810-4 may further include a fifth substrate pattern 1410-5 and a sixth substrate pattern 1410-6 in addition to the first substrate pattern 810-1, the second substrate pattern 810-2, the third substrate pattern 810-3, and the fourth substrate pattern 810-4 disposed in the active area AA. The fifth substrate pattern 1410-5 is a substrate pattern overlapping the first signal line SNL1 and the sixth substrate pattern 1410-6 is a substrate pattern overlapping the second signal line SNL2.

The fifth substrate pattern 1410-5 and the sixth substrate pattern 1410-6 which are the plurality of additional substrate patterns 1410-5 and 1410-6 may be disposed with a dot shape along the plurality of signal lines SNL. That is, the plurality of fifth substrate patterns 1410-5 overlapping the first signal line SNL1 is disposed with dot shapes which are spaced apart from each other with a predetermined interval. The plurality of sixth substrate patterns 1410-6 overlapping the second signal line SNL2 is disposed with dot shapes which are spaced apart from each other with a predetermined interval. At this time, the fifth substrate patterns 1410-5 may be formed by a plurality of dot shapes which forms one line and the sixth substrate patterns 1410-6 may be formed by a plurality of dot shapes which forms one line.

At this time, the larger the widths of the signal lines SNL disposed on the fifth substrate pattern 1410-5 and the sixth substrate pattern 1410-6 which are the plurality of additional substrate patterns 1410-5 and 1410-6, the larger the thicknesses of the fifth substrate pattern 1410-5 and the sixth substrate pattern 1410-6 which are the plurality of additional substrate patterns 1410-5 and 1410-6. As described above, since the width of the second signal line SNL2 is larger than the width of the first signal line SNL1, the thickness of the sixth substrate pattern 1410-6 may be larger than the thickness of the fifth substrate pattern 1410-5.

In the display device 1400 according to still another exemplary embodiment of the present disclosure, the thickness of the plurality of additional substrate patterns 1410-5 and 1410-6 of the substrate 1410 may be configured to be optimized for the LLO process. By doing this, the tearing defect in accordance with the LLO process may be improved. Specifically, in the display device 1400 according to still another exemplary embodiment of the present disclosure, as the areas of the plurality of additional substrate patterns 1410-5 and 1410-6 are increased, the thicknesses of the plurality of additional substrate patterns 1410-5 and 1410-6 are configured to be increased. A width of the first signal line SNL1 overlapping the fifth substrate pattern 1410-5 is smaller than a width of the second signal line SNL2 overlapping the sixth substrate pattern 1410-6. Therefore, the thickness of the sixth substrate pattern 1410-6 having a relatively larger area may be larger than the thickness of the fifth substrate pattern 1410-5 having a relatively smaller area. Therefore, a ratio of the sixth substrate pattern 1410-6 having a large contact area with the sacrificial layer may be increased so that the thermal conductivity of the sixth substrate pattern 1410-6 having a large contact area with the sacrificial layer may be improved. Accordingly, in the display device 1400 according to still another exemplary embodiment of the present disclosure, the thickness of the plurality of additional substrate patterns 1410-5 and 1410-6 may be configured to be optimized for the LLO process. By doing this, the tearing defect in accordance with the LLO process may be improved and the damage caused by the LLO process may be minimized.

Further, in the display device 1400 according to still another exemplary embodiment of the present disclosure, the fifth substrate pattern 1410-5 and the sixth substrate pattern 1410-6 which are the plurality of additional substrate patterns 1410-5 and 1410-6 may be disposed with a dot shape along the plurality of signal lines SNL. That is, each of fifth substrate pattern 1410-5 lines formed by a plurality of dot shapes overlaps one first signal line SNL1 and each of sixth substrate pattern 1410-6 lines formed by a plurality of dot shapes overlaps one second signal line SNL2. Therefore, one signal line SNL overlaps only one additional substrate pattern 1410-5 or 1410-6 so that the parasitic capacitance between the signal line SNL and the additional substrate patterns 1410-5 and 1410-6 may be minimized.

The exemplary embodiments of the present disclosure can also be described as follows:

According to an aspect of the present disclosure, a display device includes a plurality of substrate patterns which is disposed so as to correspond to each of the plurality of sub pixels and is formed of one of a transparent conducting oxide and an oxide semiconductor; a plurality of transistors which is disposed in each of the plurality of sub pixels above the plurality of substrate patterns; and a plurality of light emitting diodes which is connected to the plurality of substrates to be disposed in each of the plurality of sub pixels, the plurality of sub pixels includes a first sub pixel and a second sub pixel which emit different color light and among the plurality of substrate patterns, a thickness of a first substrate pattern corresponding to the first sub pixel and a thickness of a second substrate pattern corresponding to the second sub pixel are different from each other.

An area of an emission area of the first sub pixel may be larger than an area of an emission area of the second sub pixel and a thickness of the first substrate pattern may be larger than a thickness of the second substrate pattern.

The plurality of sub pixels may further include a third sub pixel and a fourth sub pixel.

The plurality of substrate patterns may further include a third substrate pattern corresponding to the third sub pixel and a fourth substrate pattern corresponding to the fourth sub pixel.

Two substrate patterns, among the first substrate pattern, the second substrate pattern, the third substrate pattern, and the fourth substrate pattern, may have the same thickness and the other two substrate patterns may have the same thickness.

Areas of the emission areas in the plurality of sub pixels may be reduced in the order of the fourth sub pixel, the first sub pixel, the third sub pixel, and the second sub pixel, the fourth substrate pattern and the first substrate pattern may have the same thickness, and the third substrate pattern and the second substrate pattern may have the same thickness.

The plurality of sub pixels may further include a third sub pixel and a fourth sub pixel.

The plurality of substrate patterns may further include a third substrate pattern corresponding to the third sub pixel and a fourth substrate pattern corresponding to the fourth sub pixel.

The first substrate pattern, the second substrate pattern, the third substrate pattern, and the fourth substrate pattern may have different thicknesses.

Areas of the emission areas in the plurality of sub pixels may be reduced in the order of the fourth sub pixel, the first sub pixel, the third sub pixel, and the second sub pixel.

Thicknesses of the plurality of substrate patterns may be reduced in the order of the fourth substrate pattern, the first substrate pattern, the third substrate pattern, and the second substrate pattern.

The plurality of substrate patterns may have a rectangular shape and may have an area larger than the area of the emission areas of the plurality of sub pixels.

The plurality of substrate patterns may overlap the emission areas of the plurality of sub pixels and may have a corresponding shape.

The display device may further comprise a second inorganic insulating layer which is disposed on the same plane as the plurality of substrate patterns, is disposed in an area excluding an area in which the plurality of substrate patterns is disposed, and is formed of a material having a thermal conductivity higher than that of the plurality of substrate patterns, and a first inorganic insulating layer which is disposed so as to be in contact with the plurality of substrate patterns and the second inorganic insulating layer on the plurality of substrate patterns and the second inorganic insulating layer and is formed of a material having a thermal conductivity lower than that of plurality of substrate patterns and the second inorganic insulating layer.

The first inorganic insulating layer may be formed of silicon oxide SiOx and the second inorganic insulating layer may be formed of silicon nitride SiNx.

A thickness of the plurality of substrate patterns may be larger than a thickness of the second inorganic insulating layer.

The display device may further comprise a plurality of signal lines disposed in the non-active area on the substrate.

The plurality of substrate patterns may further include a plurality of additional substrate patterns each overlapping the plurality of signal lines.

The thickness of the plurality of additional substrate patterns may be increased as the width of the signal line disposed on the plurality of additional substrate patterns is increased.

The plurality of additional substrate patterns may be disposed in a line shape along the plurality of signal lines.

The plurality of additional substrate patterns may be disposed in a dot shape along the plurality of signal lines.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
   a plurality of substrate patterns which is disposed so as to correspond to each of the plurality of sub pixels and is formed of one of a transparent conducting oxide and an oxide semiconductor;

a plurality of transistors which is disposed in each of the plurality of sub pixels above the plurality of substrate patterns; and a plurality of light emitting diodes which is connected to the plurality of substrates to be disposed in each of the plurality of sub pixels, wherein the plurality of sub pixels includes a first sub pixel and a second sub pixel which emit different color light and among the plurality of substrate patterns, a thickness of a first substrate pattern corresponding to the first sub pixel and a thickness of a second substrate pattern corresponding to the second sub pixel are different from each other.

2. The display device according to claim 1, wherein an area of an emission area of the first sub pixel is larger than an area of an emission area of the second sub pixel and a thickness of the first substrate pattern is larger than a thickness of the second substrate pattern.

3. The display device according to claim 1, wherein the plurality of sub pixels further includes a third sub pixel and a fourth sub pixel, the plurality of substrate patterns further includes a third substrate pattern corresponding to the third sub pixel and a fourth substrate pattern corresponding to the fourth sub pixel, and two substrate patterns, among the first substrate pattern, the second substrate pattern, the third substrate pattern, and the fourth substrate pattern, have the same thickness and the other two substrate patterns have the same thickness.

4. The display device according to claim 3, wherein areas of the emission areas in the plurality of sub pixels are reduced in the order of the fourth sub pixel, the first sub pixel, the third sub pixel, and the second sub pixel, the fourth substrate pattern and the first substrate pattern have the same thickness, and the third substrate pattern and the second substrate pattern have the same thickness.

5. The display device according to claim 1, wherein the plurality of sub pixels further includes a third sub pixel and a fourth sub pixel, the plurality of substrate patterns further includes a third substrate pattern corresponding to the third sub pixel and a fourth substrate pattern corresponding to the fourth sub pixel, and the first substrate pattern, the second substrate pattern, the third substrate pattern, and the fourth substrate pattern have different thicknesses.

6. The display device according to claim 5, wherein areas of the emission areas in the plurality of sub pixels are reduced in the order of the fourth sub pixel, the first sub pixel, the third sub pixel, and the second sub pixel, and thicknesses of the plurality of substrate patterns are reduced in the order of the fourth substrate pattern, the first substrate pattern, the third substrate pattern, and the second substrate pattern.

7. The display device according to claim 1, wherein the plurality of substrate patterns has a rectangular shape and has an area larger than the area of the emission areas of the plurality of sub pixels.

8. The display device according to claim 1, wherein the plurality of substrate patterns overlaps the emission areas of the plurality of sub pixels and has a corresponding shape.

9. The display device according to claim 1, further comprising:

a second inorganic insulating layer which is disposed on the same plane as the plurality of substrate patterns, is disposed in an area excluding an area in which the plurality of substrate patterns is disposed, and is formed of a material having a thermal conductivity higher than that of the plurality of substrate patterns; and a first inorganic insulating layer which is disposed so as to be in contact with the plurality of substrate patterns and the second inorganic insulating layer on the plurality of substrate patterns and the second inorganic insulating layer and is formed of a material having a thermal conductivity lower than that of plurality of substrate patterns and the second inorganic insulating layer.

10. The display device according to claim 9, wherein the first inorganic insulating layer is formed of silicon oxide SiOx and the second inorganic insulating layer is formed of silicon nitride SiNx.

11. The display device according to claim 9, wherein a thickness of the plurality of substrate patterns is larger than a thickness of the second inorganic insulating layer.

12. The display device according to claim 1, further comprising:

a plurality of signal lines disposed in the non-active area on the substrate, wherein the plurality of substrate patterns further includes a plurality of additional substrate patterns each overlapping the plurality of signal lines.

13. The display device according to claim 12, wherein the thickness of the plurality of additional substrate patterns is increased as the width of the signal line disposed on the plurality of additional substrate patterns is increased.

14. The display device according to claim 12, wherein the plurality of additional substrate patterns is disposed in a line shape along the plurality of signal lines.

15. The display device according to claim 12, wherein the plurality of additional substrate patterns is disposed in a dot shape along the plurality of signal lines.

* * * * *